US011129291B1

(12) United States Patent
Liu et al.

(10) Patent No.: US 11,129,291 B1
(45) Date of Patent: Sep. 21, 2021

(54) EXTENSION MECHANISM

(71) Applicant: Wistron Corporation, New Taipei (TW)

(72) Inventors: Yu-Qing Liu, New Taipei (TW); Qi Liu, New Taipei (TW); Zhi-Shen Wang, New Taipei (TW)

(73) Assignee: WISTRON CORPORATION

( * ) Notice: Subject to any disclaimer, the term of this patent is extended or adjusted under 35 U.S.C. 154(b) by 0 days.

(21) Appl. No.: 17/124,639

(22) Filed: Dec. 17, 2020

(30) Foreign Application Priority Data

Sep. 29, 2020 (CN) .......................... 202011052338.3

(51) Int. Cl.
*G06F 1/16* (2006.01)
*H05K 5/00* (2006.01)
*H05K 7/00* (2006.01)
*H05K 7/14* (2006.01)
*G06F 1/18* (2006.01)

(52) U.S. Cl.
CPC ........... *H05K 7/1408* (2013.01); *G06F 1/185* (2013.01); *H05K 7/1405* (2013.01); *H05K 7/1489* (2013.01)

(58) Field of Classification Search
CPC .. H05K 7/1408; H05K 7/1405; H05K 7/1489; H05K 7/1409; H05K 7/1407; H05K 7/1404; H05K 7/1402; H05K 7/1401; G06F 1/185; G06F 1/186
See application file for complete search history.

(56) References Cited

U.S. PATENT DOCUMENTS

| | | | | |
|---|---|---|---|---|
| 5,967,824 A * | 10/1999 | Neal | ....................... | G06F 1/184 439/157 |
| 6,406,322 B1 * | 6/2002 | Barringer | ................ | G06F 1/184 361/752 |
| 6,667,890 B1 * | 12/2003 | Barringer | ................ | G06F 1/184 361/752 |
| 6,772,246 B2 * | 8/2004 | Kim | ....................... | G06F 1/184 361/753 |
| 7,214,888 B1 * | 5/2007 | Feroli | ..................... | G06F 1/186 174/365 |
| 7,684,210 B2 * | 3/2010 | Kosugi | .................... | G06F 1/186 361/801 |
| 2016/0064040 A1 * | 3/2016 | Hartman | ................... | G06F 1/20 360/97.12 |
| 2016/0066468 A1 * | 3/2016 | Smith | ..................... | G06F 12/00 361/679.52 |
| 2017/0215297 A1 * | 7/2017 | Young | ..................... | G06F 1/186 |
| 2021/0004063 A1 * | 1/2021 | Chen | ........................ | F16B 2/10 |

* cited by examiner

*Primary Examiner* — Anthony M Haughton
(74) *Attorney, Agent, or Firm* — McClure, Qualey & Rodack, LLP

(57) ABSTRACT

An extension mechanism includes a bracket, a carrier, a slidable member, and a covering plate. The bracket includes a plurality of first buckling portions and a plurality of second buckling portions. The carrier is configured to move along a first axis relative to the bracket. A fastening portion of the carrier is configured to clamp one of the first buckling portions. The slidable member moves in a sliding groove of the covering plate along a second axis. A hook portion of the slidable member is configured to clamp one of the second buckling portions. The covering plate is connected to the slidable member and stops an extension module located on the bracket, to prevent the extension module from dropping or loosening when the extension module is vibrated.

20 Claims, 22 Drawing Sheets

EXTENSION MECHANISM

CROSS-REFERENCE TO RELATED APPLICATION

This non-provisional application claims priority under 35 U.S.C. § 119(a) to Patent Application No. 202011052338.3 filed in China, P.R.C. on Sep. 29, 2020, the entire contents of which are hereby incorporated by reference.

BACKGROUND

Technical Field

An extension mechanism, and in particular, an extension mechanism suitable for a chassis is provided.

Related Art

A cabinet of a rack servo console is generally provided with a plurality of slidable server units. The server units can bear a large number of units (for example, hard disks or flash memories), to cooperatively execute large data operation of a cloud. A plurality of extension modules are mounted in a chassis of a server, and a plurality of extension cards are arranged in each extension module. Generally, when an extension card is subject to a vibration or drop test, the extension card often falls and is damaged.

SUMMARY

In view of this, according to some embodiments, an extension mechanism includes a bracket, a carrier, a slidable member, and a covering plate. The bracket includes a plurality of first buckling portions and a plurality of second buckling portions. A connecting line of the first buckling portions is parallel to a first axis. A connecting line of the second buckling portions is parallel to a second axis. The carrier includes a fastening portion and a sliding groove, and is configured to slidably, along the first axis, connect to the bracket. The fastening portion is configured to clamp one of the plurality of first buckling portions. The slidable member includes a hook portion, is slidably, along the second axis, connect to the sliding groove. The hook portion is configured to clamp one of the plurality of second buckling portions. A length of each of the second buckling portions on the first axis corresponds to a distance between the first position and the second position. The covering plate is connected to the slidable member. The covering plate and the slidable member create an included angle.

In some embodiments, a pivot edge of the covering plate is pivotally connected to a first edge of the slidable member, to pivot between an open position and a folding position.

In some embodiments, a connecting side of the covering plate is connected to a first side of the slidable member in a pivoting-sliding manner, so that the covering plate pivots between an open position and a folding position and moves between the folding position and a clamping position. When the covering plate is at the open position, the covering plate is parallel to the slidable member, and one surface of the covering plate abuts against the bracket.

In some embodiments, the covering plate includes a pivot portion. The slidable member has a rotary shaft portion. The rotary shaft portion is pivotally connected to the pivot portion and moves along a third axis at the pivot portion. The covering plate moves between the folding position and the clamping position.

In some embodiments, each of an upper surface and a lower surface of the covering plate has a reinforcing block. The reinforcing blocks are correspondingly located at peripheries of the pivot portions.

In some embodiments, the carrier is configured to slidably connect to the bracket to move between a first position and a second position along the first axis. When the carrier is selectively located at the first position or the second position, the fastening portion is configured to clamp one of the first buckling portions. The slidable member is configured to slidably connect to the sliding groove to move between a third position and a fourth position along the second axis. When the slidable member is selectively located at the third position or the fourth position, the hook portion is configured to clamp one of the second buckling portions. The connecting side has a clamping portion. The bracket has four clamping holes. When the carrier is selectively located at the first position or the second position, the clamping portion is clamped to one of two clamping holes. When the slidable member is selectively located at the third position or the fourth position, the clamping portion is clamped to one of the other two clamping holes.

In some embodiments, the carrier is configured to slidably connected to the bracket to move between a first position and a second position along the first axis. When the carrier is selectively located at the first position or the second position, the fastening portion is configured to clamp one of the first buckling portions. The slidable member is configured to slidably connected to the sliding groove to move between between a third position and a fourth position along the second axis. When the slidable member is selectively located at the third position or the fourth position, the hook portion is configured to clamp one of the second buckling portions. The connecting side has two clamping portions, the bracket has six clamping holes. When the carrier is selectively located at the first position or the second position, the two clamping portions are respectively clamped to two of three clamping holes. When the slidable member is selectively located at the third position or the fourth position, the two clamping portions are respectively clamped to two of the other three clamping holes.

In some embodiments, the clamping portion has a bump. When the clamping portion is located in the clamping hole, the bump is in contact with an inner side of the clamping hole. The bump has a guide surface. The guide surface is configured to guide the clamping portion to enter the clamping hole.

In some embodiments, a front section and a rear section of the guide surface respectively have an inclined section and a horizontal section The inclined section is configured to guide the clamping portion to obliquely enter the clamping hole The horizontal section is configured to guide the clamping portion to vertically enter the clamping hole.

In some embodiments, the clamping portion has bumps respectively located at an upper surface and a lower surface of the covering plate. The bumps are in contact with inner walls of the clamping holes to make the covering plate to be substantially perpendicular to the slidable member.

In some embodiments, a first side of the slidable member has a convex point. The convex point corresponds to a side end of the covering plate.

In some embodiments, the bracket includes four buckling groups. Each buckling group includes two first buckling portions. The carrier includes four fastening portions. The four fastening portions are in a one-to-one correspondence to the four buckling groups. Each fastening portion is selectively clamped to one of the two first buckling portions of the corresponding buckling group.

In some embodiments, the first buckling portion is a through hole. The fastening portion is an elastic piece. The elastic piece is selectively clamped to one of two adjacent through holes. An end portion of the elastic piece has a guide section and a stop section extending outward from the guide section.

In some embodiments, each buckling group includes two positioning portions. The carrier includes four docking portions. The four docking portions are in a one-to-one correspondence to the buckling groups. Each docking portion is selectively clamped to one of the two positioning portions of the corresponding buckling group.

In some embodiments, the bracket includes a transverse groove hole. The transverse groove hole is adjacent to the first buckling portion. The carrier has a moving portion corresponding to the transverse groove hole.

In some embodiments, the bracket includes two longitudinal groove holes. Each of the second buckling portions has a groove. The hook portion includes an elastic arm and a hook part at an end portion of the elastic arm. The hook part is selectively clamped to one of two grooves. The elastic arm is selectively located at one of the two longitudinal groove holes. The carrier includes a concave portion. The concave portion is located at an inner side of the sliding groove for movement of the elastic arm.

In some embodiments, the carrier includes a slide portion. The slide portion has an entering section and a translating section. The bracket includes a limiting member. The limiting member is docked to the slide portion to slide from the entering section to the translating section.

In some embodiments, a free side of the covering plate has a bent portion. The bent portion extends along the second axis.

In some embodiments, a movement range of the carrier on the first axis on the bracket is within 21 mm to 25 mm. A movement range of the slidable member on the second axis on the bracket is within 40.25 mm to 44.25 mm.

In some embodiments, the covering plate and the slidable member are integrated in one piece.

In conclusion, according to some embodiments, the covering plate of the extension mechanism is disposed on one side of an extension module of the bracket. When the extension mechanism having the extension module is vibrated due to vibration drop test, transportation, artificial or natural factors, the covering plate can prevent the extension module from loosening or dropping. According to some embodiments, the carrier may be selectively positioned at two positions along the first axis, and the slidable member may be selectively positioned at two positions along the second axis. Therefore, the covering plate has four positioning positions, that is, four different positioning sizes are formed between the covering plate and the bracket. In other words, a single mechanism provides positioning capability for extension modules of four standards, respectively full-height half-length (FHHL), full-height full-length (FHFL), half-height half-length (HHHL), or half-height full-length (HHFL). The movement of the extension module can be limited. Furthermore, according to some embodiments, positioning sizes of the covering plate, the slidable member, the carrier, and the bracket may be changed without tools. In addition, according to some embodiments, the covering plate is pivotally connected to the slidable member. One side of the covering plate is clamped to the bracket. The other side of the covering plate is fixed to the extension module, thereby achieving a lever labor-saving effect.

DETAILED DESCRIPTION

Figure 1:
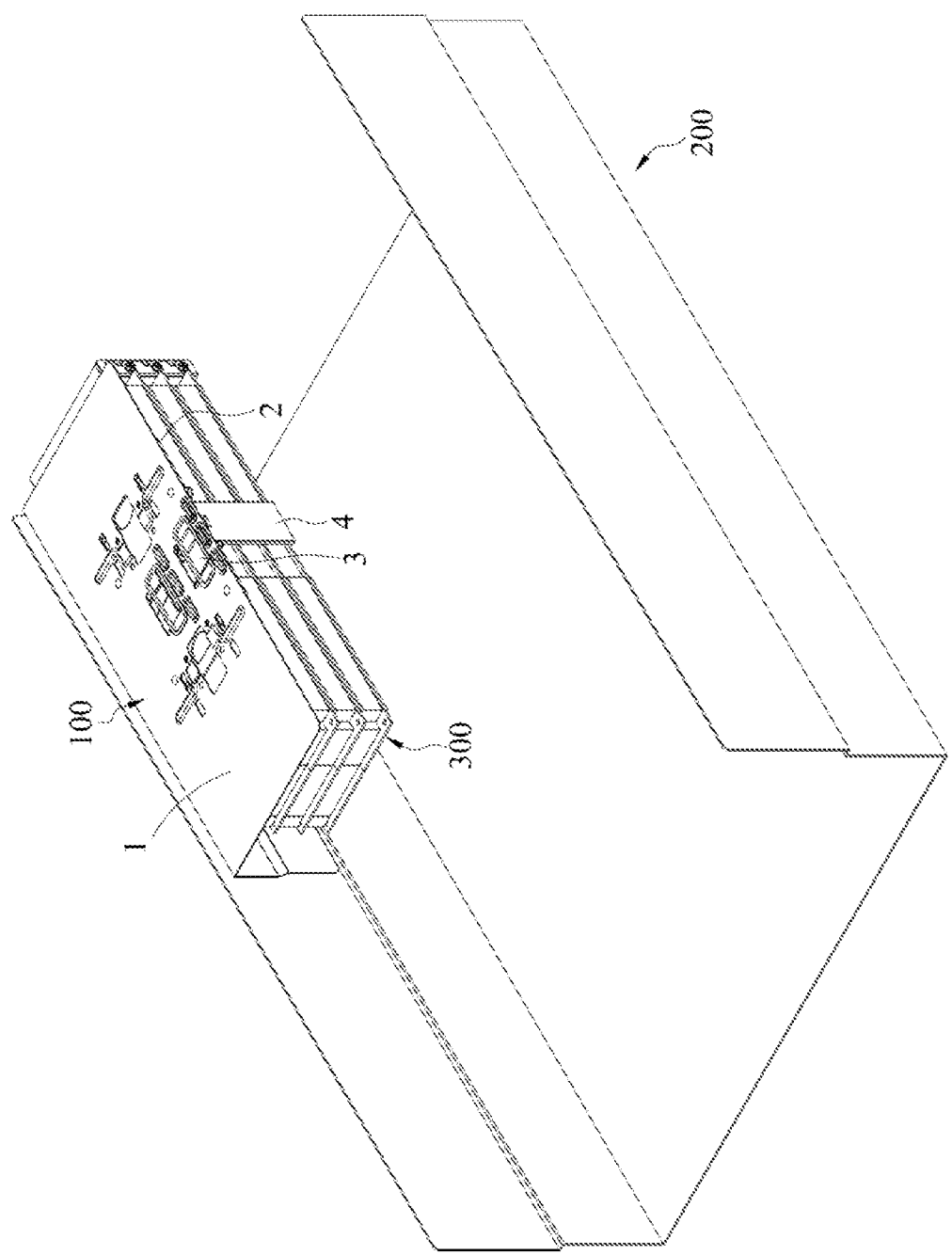
FIG. 1 illustrates a schematic appearance diagram of a chassis having an extension mechanism according to some embodiments.

FIG. 1 illustrates a schematic appearance diagram of a chassis 200 having an extension mechanism 100 according to some embodiments. A network device, for example, a switch, a router, or a hardware firewall, uses a rack structure. A height of a rack server is in the unit of U (1U is equal to 1.75 inches and equal to 44.45 mm), and there are usually several standard servers from 1U to 7U. In some embodiments, the extension mechanism 100 is applied to a 4U chassis 200, but this application is not limited thereto. In some embodiments, the extension mechanism 100 may be applied to any chassis 200 from 1U to 7U.

In some embodiments, three extension mechanisms 100 are mounted in the chassis 200 (FIG. 1 is merely schematic showing that one extension mechanism 100 is mounted in the chassis 200). In some embodiments, any number of extension mechanisms 100 may be mounted in the chassis 200, and the extension mechanisms 100 may be mounted at any position in the chassis 200, and may be arranged symmetrically or asymmetrically (for example, in a mirrored arrangement manner).

In some embodiments, each extension mechanism 100 includes an extension module 300, and the extension mechanism 100 is configured to limit a degree of freedom of the top of the extension module 300. Specifically, the top of the extension module 300 is the edge of the extension module 300 adjacent the covering plate 4 in FIG. 1. The extension mechanism 100 is configured to prevent the extension module 300 from moving beyond the covering plate 4. The extension module 300 may be, but not limited to, an extension card, for example, a peripheral component interconnect express (PCIe) card, the extension mechanism 100 is configured to limit a degree of freedom of the top of the extension card, and an electrical port at the bottom of the extension card is in contact with the inside of the extension mechanism 100 (described later, and not shown in the figure). In some embodiments, the extension module 300 may be another device, for example, a hard disk. In addition, there may be a plurality of extension cards (for example, three or four) or one extension card.

Figure 2:
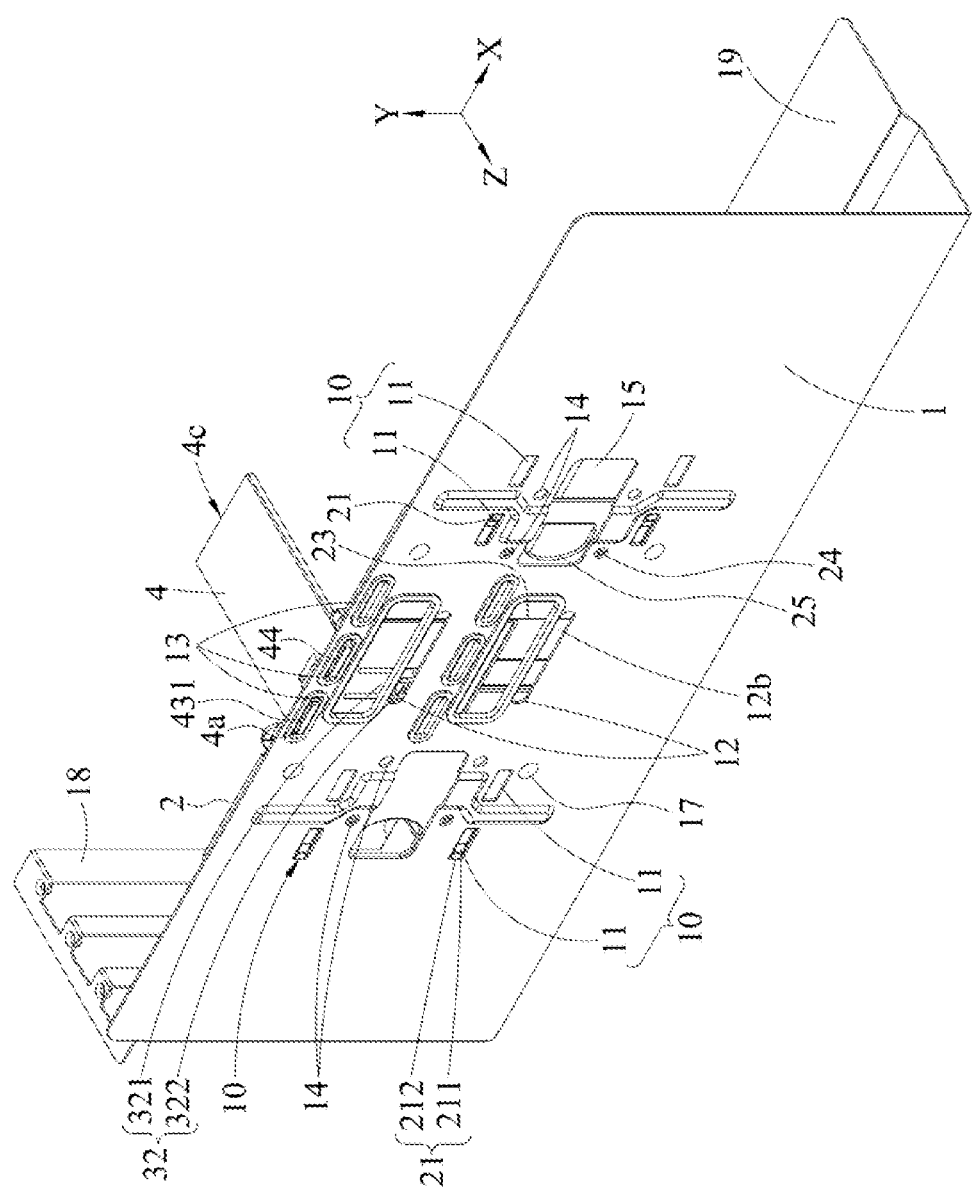
FIG. 2 illustrates a schematic appearance diagram of an extension mechanism according to some embodiments.
Figure 3:
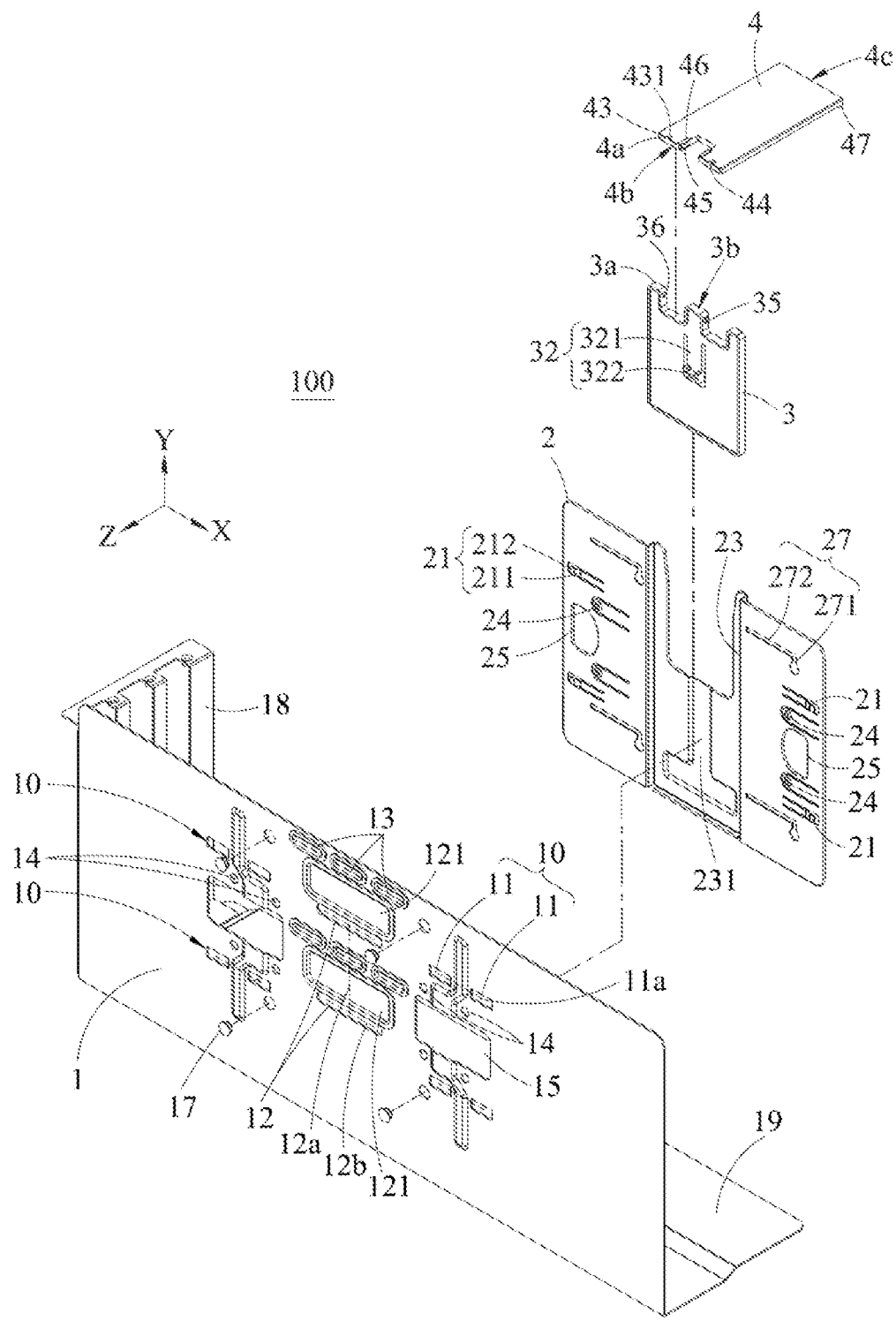
FIG. 3 illustrates a schematic exploded view of an extension mechanism according to some embodiments.

Referring to FIG. 2 and FIG. 3 together, FIG. 2 is a schematic appearance diagram of the extension mechanism 100; and FIG. 3 is a schematic exploded view of the extension mechanism 100. In some embodiments, the extension mechanism 100 includes a bracket 1, a carrier 2, a slidable member 3, and a covering plate 4.

The bracket 1 includes a plurality of first buckling portions 11 and a plurality of second buckling portions 12, connecting lines 11a of the first buckling portions 11 are parallel to a first axis X, and connecting lines 12a of the second buckling portions 12 are parallel to a second axis Y (the connecting line 11a and the connecting line 12a are schematic imaginary lines in FIG. 3).

Figure 8:
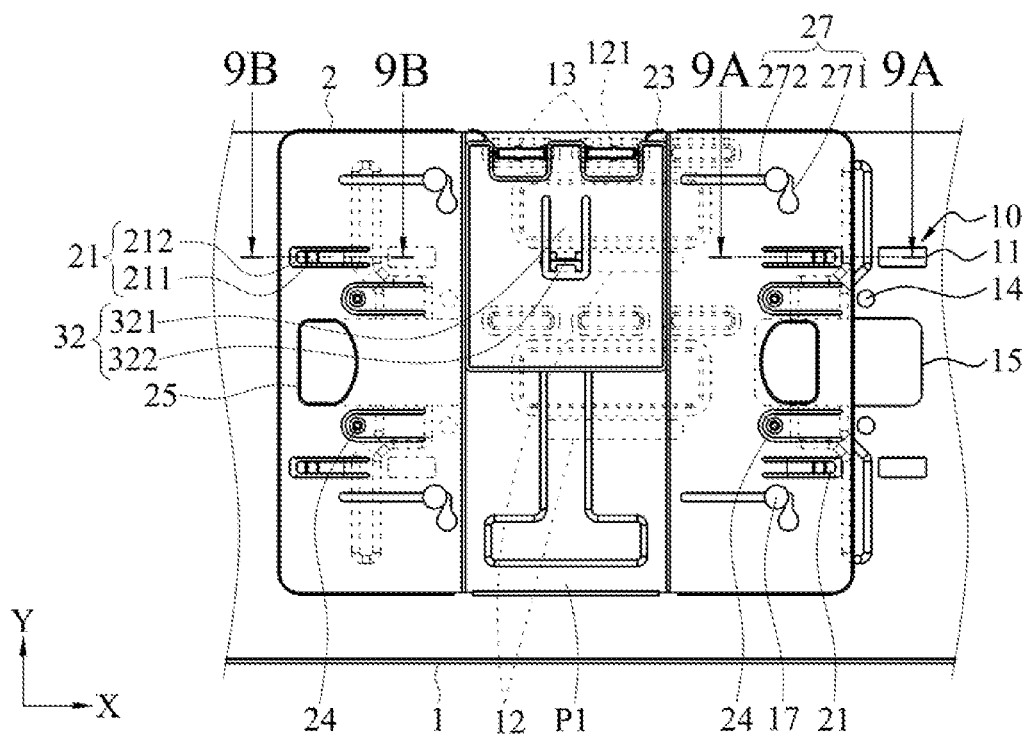
FIG. 8 illustrates a schematic rear view of a bracket and a carrier according to some embodiments, showing a state that the carrier is located at a first position P1.
Figure 10:
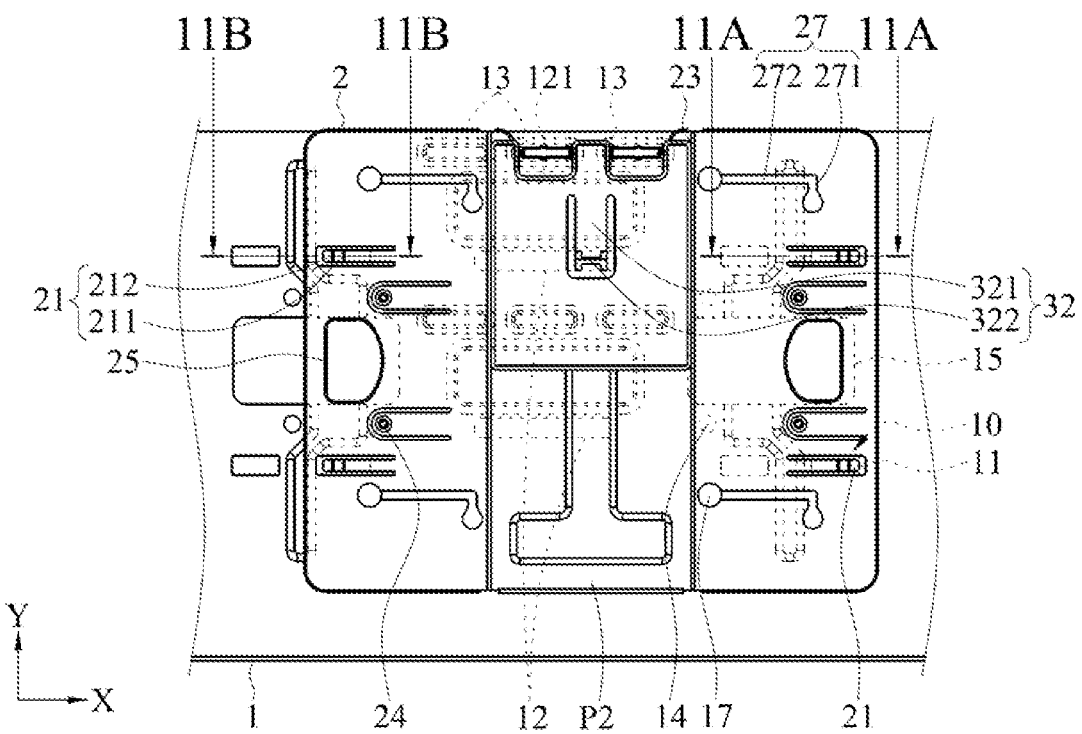
FIG. 10 illustrates a schematic rear view of a bracket and a carrier according to some embodiments, showing a state that the carrier is located at a second position P2.

The carrier 2 includes a fastening portion 21 and a sliding groove 23. The carrier 2 is configured to slidably, along the first axis X, connect to the bracket 1 and the fastening portion 21 is configured to clamp one of the first buckling portions 11. The first buckling portions 11 are spaced away from each other. In some embodiments, the carrier 2 is configured to move between a first position P1 and a second position P2 (as shown in FIG. 8 and FIG. 10) along the first axis X relative to the bracket 1. When the carrier 2 is selectively located at the first position P1 or the second position P2, the fastening portion 21 is configured to clamp one of the first buckling portions 11.

Figure 14:
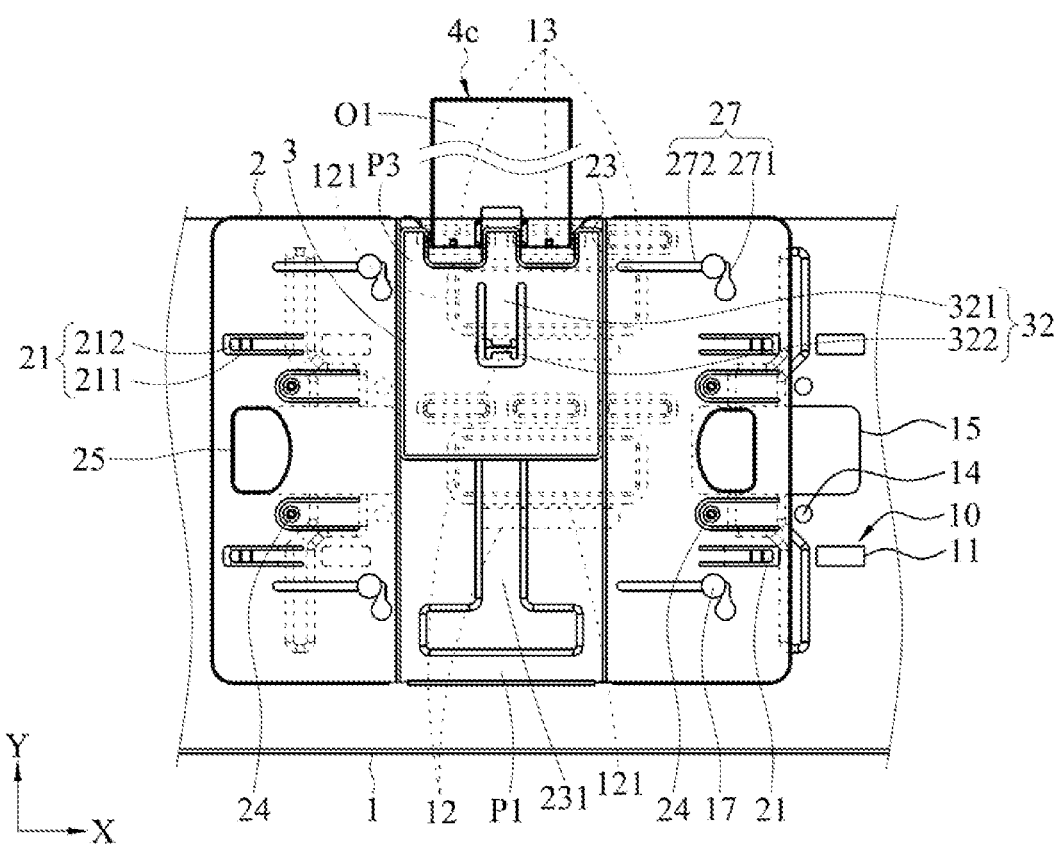
FIG. 14 illustrates a schematic rear view of a bracket and a carrier according to some embodiments, showing a state that a slidable member is located at a third position P3.
Figure 15:
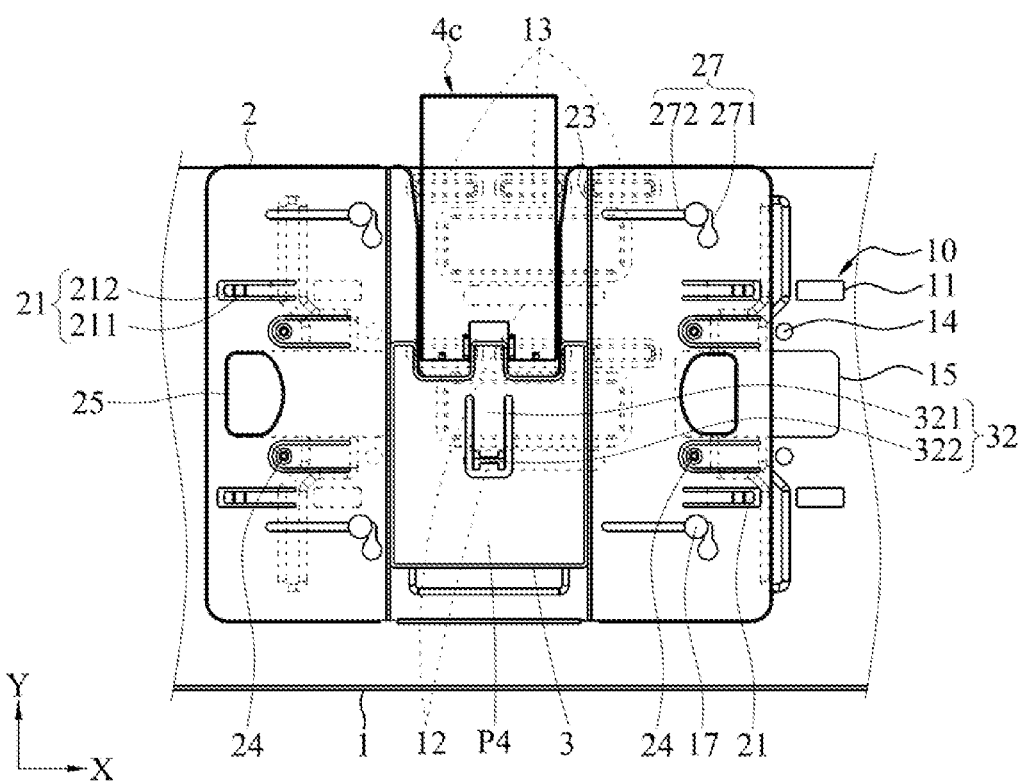
FIG. 15 illustrates a schematic rear view of a bracket and a carrier according to some embodiments, showing a state that a slidable member is located at a fourth position P4.

The slidable member 3 includes a hook portion 32. The slidable member 3 is configured to slidably, along the second axis Y, connect to the sliding groove 23 and the hook portion 32 is configured to clamp one of the second buckling portions 12. The second buckling portions 12 are spaced from each other. In some embodiments, the slidable member 3 is disposed at the sliding groove 23 to move between a third position P3 and a fourth position P4 (as shown in FIG. 14 and FIG. 15) along the second axis Y. When the slidable member 3 is selectively located at the third position P3 or the fourth position P4, the hook portion 32 is configured to clamp one of the second buckling portions 12. A length 12b of each of the second buckling portions 12 on the first axis X corresponds to a distance between the first position P1 and the second position P2 (the length 12b is a schematic imaginary line in FIG. 3).

Figure 16:
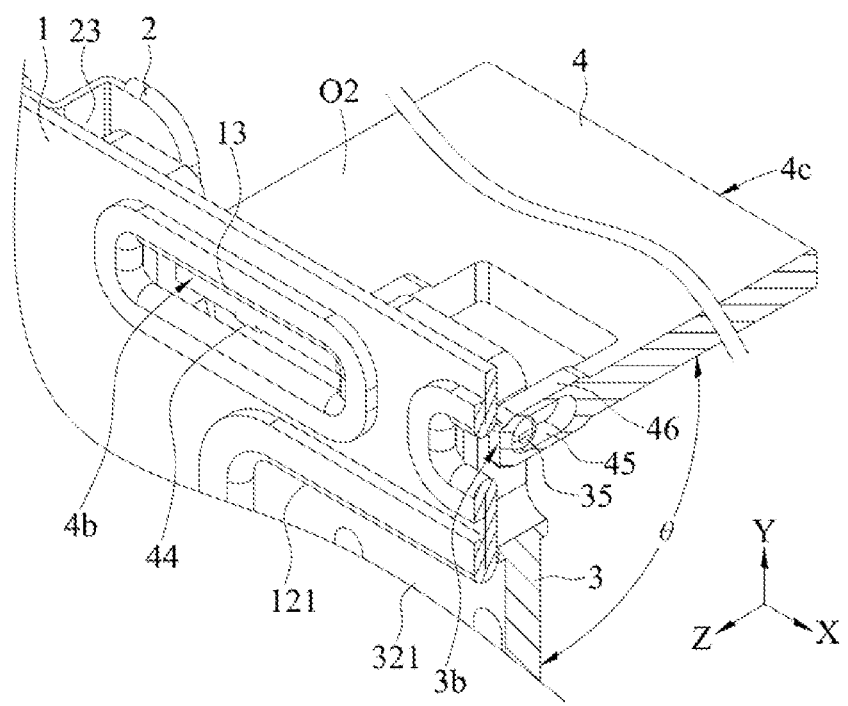
FIG. 16 illustrates a schematic partial cross-sectional view of an appearance of a covering plate and a bracket according to some embodiments, showing a state that the covering plate is located at a folding position.

The covering plate 4 is connected to the slidable member 3. The covering plate 4 and the slidable member 3 create an included angle θ (as shown in FIG. 16).

After the extension module 300 is mounted on the bracket 1, the carrier 2 may move along the first axis X relative to the bracket 1 and is positioned at the first position P1 or the second position P2. Because the slidable member 3 is located on the carrier 2, the carrier 2 synchronously drives the slidable member 3 to move when moving. The slidable member 3 is slidably disposed on the sliding groove 23, may move along the second axis Y relative to the carrier 2, and is positioned at the third position P3 or the fourth position P4. When the slidable member 3 is positioned, the covering plate 4 is located adjacent the top of the extension module 300 (the top of the extension module 300 of an FHHL standard shown in FIG. 29), and limits the degree of freedom of the top of the extension module 300, to prevent the extension module 300 from loosening or dropping when the extension module 300 is vibrated due to vibration drop test, transportation, artificial or natural factors.

Referring to FIG. 1 and FIG. 2 together, in some embodiments, during mounting, a user electrically connects the extension module 300 to a circuit board on a bottom plate 19 of the bracket 1, the bottom plate 19 has the circuit board and a socket on the circuit board, and an electrical port at the bottom of the extension module 300 is connected to the socket (not shown in the figure). After the extension module 300 is connected to the socket, the user passes an electrical port at a side end of the extension module 300 through a side plate 18 of the bracket 1 and electrically connects the side end to a device outside the chassis 200 (not shown in the figure). When the slidable member 3 is positioned, the covering plate 4 limits a degree of freedom of upward movement of the extension module 300 (as shown in right of the extension module 300 of the view in FIG. 1).

In some embodiments, the first axis X is an X axis of a three-dimensional coordinate system, the second axis Y is a Y axis of the three-dimensional coordinate system, and a third axis Z is a Z axis of the three-dimensional coordinate system. The first buckling portions 11 are in a side-by-side relationship, and the connecting lines 11a connected between the first buckling portions 11 are parallel to the X axis. The second buckling portions 12 are in a side-by-side relationship, and the connecting lines 12a connected between the second buckling portions 12 are parallel to the Y axis.

In some embodiments, the first axis X and the second axis Y are disposed in a non-parallel manner, and the first axis X is substantially perpendicular to the second axis Y. In some embodiments, there is an angle between the first axis X and the second axis Y, and the angle may be any angle in a range of 25 degrees to 90 degrees. The third axis Z is disposed non-parallel to the first axis X and the second axis Y, the first axis X and the second axis Y are substantially perpendicular to the third axis Z. In some embodiments, the third axis Z has an angle with the first axis X and the second axis Y, and the angle may be any angle in a range of 25 degrees to 90 degrees.

In some embodiments, when at the first position P1 of the bracket 1 (as shown in FIG. 8), the carrier 2 is relatively at a left side position of the bracket 1. When at the second position P2 of the bracket 1 (as shown in FIG. 10), the carrier 2 is relatively at a right side position of the bracket 1. When at the third position P3 in the sliding groove 23 (as shown in FIG. 14), the slidable member 3 is relatively at an upper position of the sliding groove 23. When at the fourth position P4 in the sliding groove 23 (as shown in FIG. 15), the slidable member 3 is relatively at a lower position of the sliding groove 23.

Figure 4:
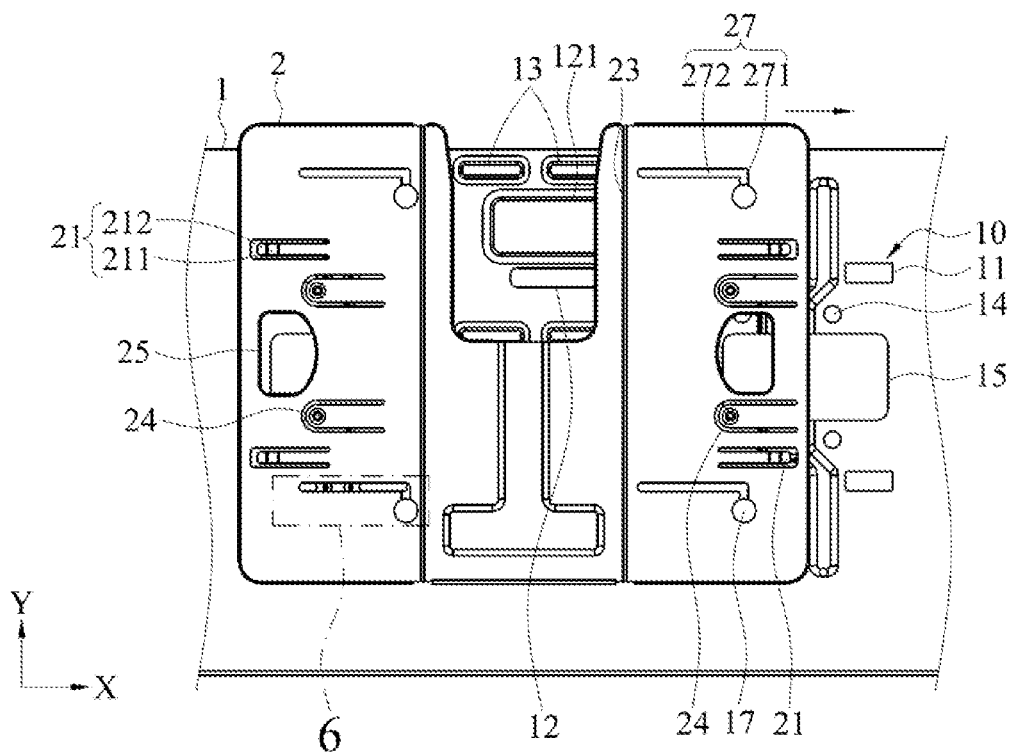
FIG. 4 illustrates a schematic rear view of a bracket and a carrier from a perspective of FIG. 2 according to some embodiments, that is, shows a state that a limiting member of the bracket is located at a slide portion of the carrier from the perspective of an origin of coordinates toward a +Z direction in the view of FIG. 2.
Figure 5:
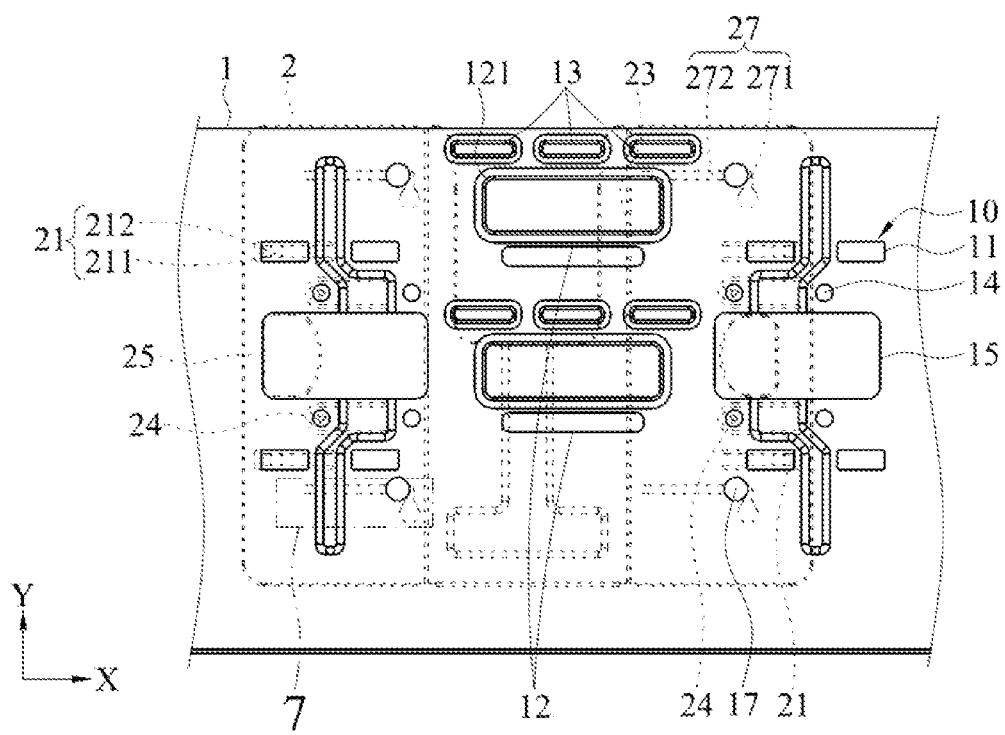
FIG. 5 illustrates a schematic front view of a bracket and a carrier according to some embodiments, showing a state that a limiting member of the bracket is located at a translating section of a slide portion of the carrier.
Figure 6:
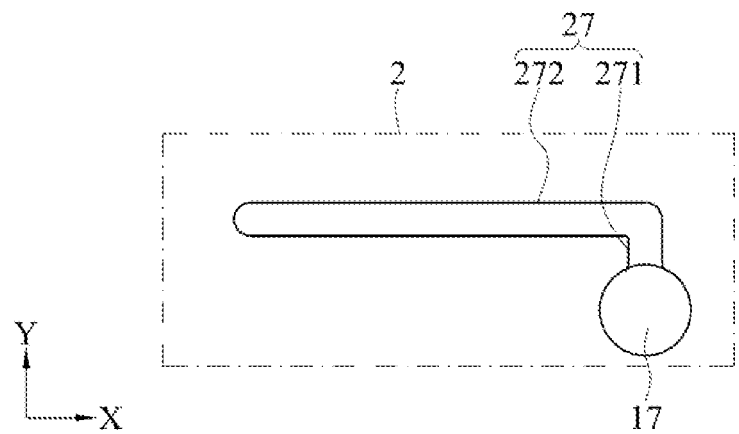
FIG. 6 illustrates an enlarged schematic view of a center line frame marked with 6 in FIG. 4.
Figure 7:
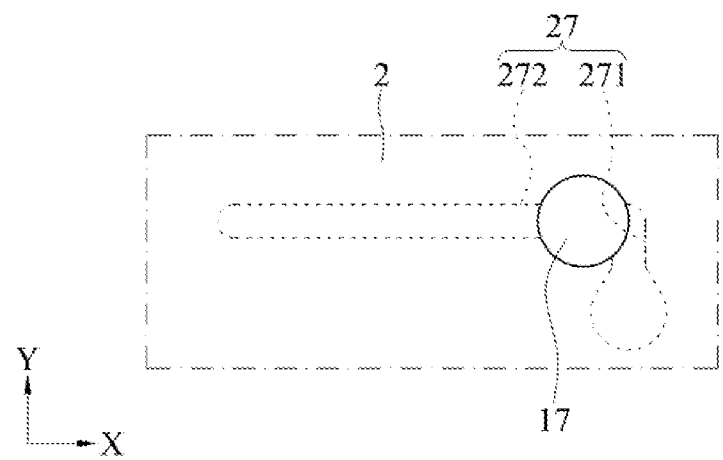
FIG. 7 illustrates an enlarged schematic view of a center line frame marked with 7 in FIG. 5.

Referring to FIG. 3 to FIG. 7 together, FIG. 4 is a schematic rear view of the bracket 1 and the carrier 2 from the perspective of FIG. 2 according to some embodiments, that is, shows a state that a limiting member 17 of the bracket 1 is located at a slide portion 27 of the carrier 2 from the perspective of an origin of three-dimensional coordinates toward a +Z direction in the view of FIG. 2; FIG. 5 is a schematic front view of the bracket 1 and the carrier 2; FIG. 4 and FIG. 5 are respectively schematic diagrams of assembly processes of the bracket 1 and the carrier 2; FIG. 6 is an enlarged schematic view of a center line frame marked with 6 in FIG. 4; and FIG. 7 is an enlarged schematic view of a center line frame marked with 7 in FIG. 5. In some embodiments, the carrier 2 includes a slide portion 27. Herein, the slide portion 27 includes a slide rail and has an entering section 271 and a translating section 272, and the bracket 1 includes a limiting member 17. In some embodiments, the limiting member 17 is a retaining ring. The limiting member 17 is buckled into the slide portion 27, and the limiting member 17 may slide from the entering section 271 to the translating section 272. That the carrier 2 includes a slide rail and the bracket 1 includes a retaining ring are merely examples. In some embodiments, the carrier 2 includes a retaining ring, and the bracket 1 includes a slide rail.

When the carrier 2 is to be mounted on the bracket 1, a tail end of the entering section 271 of the slide portion 27 of the carrier 2 is first aligned with the limiting member 17 on the bracket 1 for buckling, so that the limiting member 17 is buckled into an opening formed on one side of the entering section 271 (a round hole at the tail end (at the lower side) of the entering section 271 shown in FIG. 4 and FIG. 7). The carrier 2 is then pushed downward along the second axis Y, so that the limiting member 17 is buckled into the other side of the entering section 271 (as shown in FIG. 5). Then, the carrier 2 may move along the first axis X. The limiting member 17 is buckled into the translating section 272, so that the carrier 2 may move along the first axis X relative to the bracket 1, and when the carrier 2 moves between the first position P1 and the second position P2 (as shown in FIG. 8 and FIG. 10) along the first axis X, the limiting member 17 moves within the translating section 272. In some embodiments, the limiting member 17 is a retaining ring assembly having an approximately I-shaped cross section, and the limiting member 17 is buckled into the slide portion 27 to have an effect that the carrier 2 can be disassembled and assembled by a tool.

In some embodiments, the entering section 271 and the translating section 272 are substantially perpendicular to each other, and the entering section 271 extends downward at one end of the translating section 272. When the carrier 2 is to be separated from the bracket 1 (referring to FIG. 6 and FIG. 7), the carrier 2 may be pushed along the first axis X, so that the limiting member 17 moves from the translating section 272 to one end of the entering section 271, and then the carrier 2 is pushed upward along the second axis Y, so that the limiting member 17 moves to an opening at the other end of the entering section 271, and the carrier 2 can be removed and an opening on the carrier 2 is separated from the limiting member 17. There are four limiting members 17 and four slide portions 27 shown in FIG. 3 to FIG. 5, but this application is not limited thereto, and there may be one, two, three, or more limiting members and slide portions. During the design, a quantity of the limiting members 17 and a quantity of the slide portions 27 and a common difference may be adjusted according to stability of the buckling between the carrier 2 and the bracket 1.

Figure 11A:
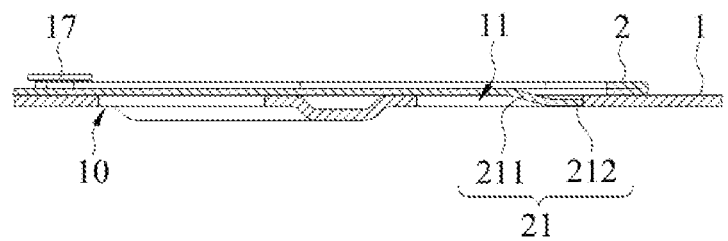
FIG. 11A illustrates a schematic cross-sectional view of a position 11A-11A in FIG. 10.
Figure 11B:
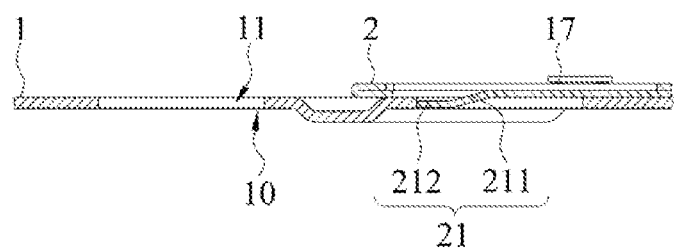
FIG. 11B illustrates a schematic cross-sectional view of a position 11B-11B in FIG. 10.

Referring to FIG. 3, and with reference to FIG. 8 to FIG. 11B, FIG. 8 is a schematic rear view of the bracket 1 and the carrier 2; FIG. 9A is a schematic cross-sectional view of a position 9A-9A in FIG. 8; FIG. 9B is a schematic cross-sectional view of a position 9B-9B in FIG. 8; FIG. 10 is a schematic rear view of the bracket 1 and the carrier 2, showing a state that the carrier 2 is located at a second position P2; FIG. 11A is a schematic cross-sectional view of a position 11A-11A in FIG. 10, and FIG. 11B is a schematic cross-sectional view of a position 11B-11B in FIG. 10. In some embodiments, referring to FIG. 3, the bracket 1 includes four buckling groups 10, each buckling group 10 includes two first buckling portions 11, the carrier 2 includes four fastening portions 21, the fastening portions 21 are in a one-to-one correspondence to the buckling groups 10, and each fastening portion 21 is selectively clamped to one of the two first buckling portions 11 of the corresponding buckling group.

The connecting line 11a of the two first buckling portions 11 of each buckling group 10 is substantially parallel to the first axis X. In the embodiment shown in FIG. 3, the four buckling groups 10 are arranged in a two-dimensional array manner. A connecting line of two buckling groups 10 at a right side is substantially parallel to the second axis Y (the connecting line is a connecting line of a corresponding position of the buckling groups 10), and a distance between the two buckling groups 10 at the right side along the second axis Y is substantially the same as a distance between the third position P3 and the fourth position P4. A connecting line of two buckling groups 10 at a left side is substantially parallel to the second axis Y, and a distance between the two buckling groups 10 at the left side along the second axis Y is substantially the same as the distance between the third position P3 and the fourth position P4.

The fastening portions 21 are in a one-to-one correspondence to the buckling groups 10, one fastening portion 21 may be selectively clamped one of two first buckling portions 11 of the corresponding buckling group 10. That is, when the carrier 2 is configured to move between the first position P1 and the second position P2 along the first axis X relative to the bracket 1, four fastening portions 21 are selectively clamped to one of the two first buckling portions 11 of the corresponding four buckling groups 10. During the design, a quantity and positions of the buckling groups 10 and the fastening portions 21 may be adjusted according to stability of the carrier 2 when the carrier 2 moves relative to the bracket 1 and stability of clamping. In some embodiments, there may be one, two, three, or more buckling groups 10 and fastening portions 21.

Refer to FIG. 3 again with reference to FIG. 8 to FIG. 11B. Referring to FIG. 3 first, in some embodiments, the first buckling portion 11 is a through hole or a groove (the following uses the through hole as an example for description, and the through hole is marked as the same as the first buckling portion 11). The fastening portion 21 is an elastic piece (the following uses the elastic piece as an example for description, and the elastic piece is marked as the same as the fastening portion 21), and each elastic piece 21 is selectively clamped to one of two adjacent through holes 11. The elastic piece 21 includes a guide section 211 and a stop section 212 extending outward from the guide section 211. When a user presses the stop section 212 (presses from bottom to top in the view of FIG. 9A), the stop section 212 may be separated from the through hole 11. In this case, the carrier 2 is pushed to move along the first axis X (a horizontal direction in FIG. 9A). When moving to the other through hole 11, the elastic piece 21 springs into the through hole 11, and the stop section 212 is clamped to the other through hole 11.

It is noted that the four fastening portions 21 of the carrier 2 are selectively clamped to one of the two adjacent through holes 11 of the four buckling groups 10 along the first axis X. When the fastening portion 21 is the elastic piece, two elastic pieces 21 on the right side and two elastic pieces 21 on the left side are opposite in a structural direction and are mutually mirrored. Herein, the elastic pieces 21 on the right side sequentially form the guide section 211 and the stop section 212 from left to right (as shown in FIG. 8 and FIG. 9A), and the elastic pieces 21 on the left side sequentially form the guide section 211 and the stop section 212 from right to left (as shown in FIG. 8 and FIG. 9B).

Figure 9A:
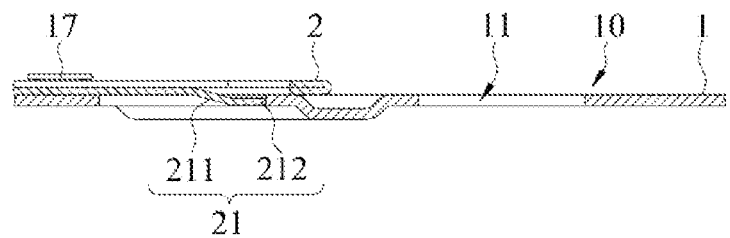
FIG. 9A illustrates a schematic cross-sectional view of a position 9A-9A in FIG. 8.
Figure 9B:
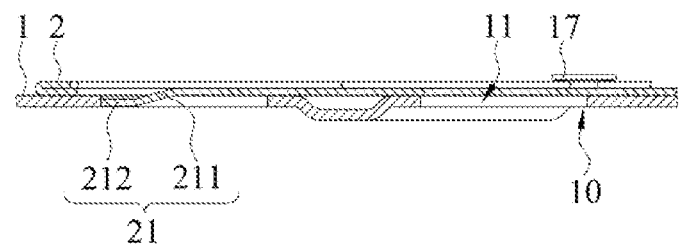
FIG. 9B illustrates a schematic cross-sectional view of a position 9B-9B in FIG. 8.

When the carrier 2 is located at the first position P1 (as shown in FIG. 8), the stop sections 212 of the elastic pieces 21 on the left side are respectively and correspondingly clamped to the left through holes 11 of two buckling groups 10 on the left side (as shown in FIG. 9B), and the stop sections 212 of the elastic pieces 21 on the right side are respectively and correspondingly clamped to the left through holes 11 of the two buckling groups 10 on the right side (as shown in FIG. 9A). The stop sections 212 of the elastic pieces 21 on the left side are clamped to left sides of the corresponding through holes 11, to prevent the carrier 2 from moving to the left side again. The stop sections 212 on the right side are clamped to right sides of the corresponding through holes 11, to prevent the carrier 2 from moving to the right side again. Therefore, the stop section 212 is clamped to the corresponding through hole 11, so that the carrier 2 can be stably located at the first position P1.

When a user wants to move the carrier 2 from the first position P1 to the second position P2 (the carrier 2 shown in FIG. 8 moves right to a position of the carrier 2 shown in FIG. 10), the user may press the stop sections 212 of the two elastic pieces 21 on the right side (that is, the stop sections 212 shown in FIG. 9A), so that the stop sections 212 on the right side are separated from the corresponding through holes 11. Then, when the carrier 2 is pushed to move from the first position P1 toward the second position P2 (that is, a right side direction in the view of FIG. 8), the guide sections 211 of the elastic pieces 21 on the left side are guided in a forward direction to be separated from the corresponding through holes 11, and the elastic pieces 21 are pushed by the bracket 1 to be retracted upward in FIG. 9B.

When the carrier 2 is located at the second position P2 (as shown in FIG. 10), the elastic piece 21 rebounds into the corresponding through hole 11. Specifically, the stop sections 212 of the elastic pieces 21 on the left side are respectively and correspondingly clamped to the right through holes 11 of the buckling groups 10 on the left side, and the stop sections 212 of the elastic pieces 21 on the right side are respectively and correspondingly clamped to the right through holes 11 of the buckling groups 10 on the right side. The stop sections 212 on the left side are clamped to the left sides of the corresponding through holes 11, to prevent the carrier 2 from moving to the left side again, and the stop sections 212 on the right side are clamped to the right sides of the corresponding through holes 11, to prevent the carrier 2 from moving to the right side again.

When a user wants to move the carrier 2 from the second position P2 to the first position P1 (the carrier 2 shown in FIG. 10 moves left to a position of the carrier 2 shown in FIG. 8), the user may press the stop sections 212 of the elastic pieces 21 on the left side and then move the carrier 2 to the left side shown in FIG. 10, and the carrier 2 can be positioned at the first position P1. The actions are similar, and therefore details are not described herein again.

In some embodiments, a movement range of the carrier 2 on the first axis X on the bracket 1 is within 21 mm to 25 mm, for example, but not limited to, 22 mm, 23 mm, or 24 mm. The movement range is a distance by which the carrier 2 moves between the first position P1 and the second position P2.

Referring to FIG. 3 again, in some embodiments, each buckling group 10 includes two positioning portions 14. Herein, the positioning portion 14 is a through hole or a groove (the following uses the through hole 14 as an example for description, and the through hole is marked as the same as the positioning portion 14). The carrier 2 includes four docking portions 24. In some embodiments, the docking portion 24 is a protrusion, and the protrusion may be in various shapes, for example, a circle, a triangle, a square, or a semi-circle. The docking portions 24 are in a one-to-one correspondence to the buckling groups 10, and each docking portion 24 is selectively clamped to one of the two positioning portions 14 of the corresponding buckling group 10. That the carrier 2 includes a protrusion and each buckling group 10 includes a through hole 14 are merely examples. In some embodiments, the carrier 2 includes a through hole, and the buckling group 10 includes a protrusion. In some embodiments of FIG. 3, the bracket 1 includes eight positioning portions 14, and the carrier 2 includes four protrusions 24. However, a quantity of the positioning portions 14 and a quantity of the protrusions 24 are not limited thereto. In some embodiments, the bracket 1 includes six positioning portions 14, and the carrier 2 includes three protrusions 24, or the bracket 1 includes two positioning portions 14, and the carrier 2 includes one protrusion 24.

A connecting line of the two positioning portions 14 of each buckling group 10 is substantially parallel to the first axis X. In the embodiment shown in FIG. 3, the four buckling groups 10 are arranged in a two-dimensional array manner, a connecting line of two buckling groups 10 on the right side is substantially parallel to the second axis Y (the connecting line is a connecting line of a corresponding position of the buckling group 10), and a distance between the two buckling groups 10 on the right side along the second axis Y is substantially the same as or different from a distance between the third position P3 and the fourth position P4 (as shown in FIG. 14 and FIG. 15, the distance between the two buckling groups 10 on the upper and lower right sides along the second axis Y is greater than the distance between the third position P3 and the fourth position P4 when the slidable member 3 is located in the sliding groove 23 and moves between the third position P3 and the fourth position P4 along the second axis Y). A connecting line of two buckling groups 10 on the left side is substantially parallel to the second axis Y, and a distance between the two buckling groups 10 on the left side along the second axis Y is substantially the same as or different from the distance between the third position P3 and the fourth position P4 (as shown in FIG. 14 and FIG. 15, the distance between the two buckling groups 10 on the upper and lower left sides along the second axis Y is greater than the distance between the third position P3 and the fourth position P4 when the slidable member 3 is located in the sliding groove 23 and moves between the third position P3 and the fourth position P4 along the second axis Y).

The docking portions 24 are in a one-to-one correspondence to the buckling groups 10, and one docking portion 24 is selectively clamped between two positioning portions 14 of one buckling group 10. When the carrier 2 moves between the first position P1 and the second position P2 along the first axis X relative to the bracket 1, four docking portions 24 are separately and selectively clamped between the two positioning portions 14 of the corresponding four buckling groups 10. When the docking portion 24 is clamped to the positioning portion 14, a positioning effect between the carrier 2 and the bracket 1 is enhanced.

Figure 27:
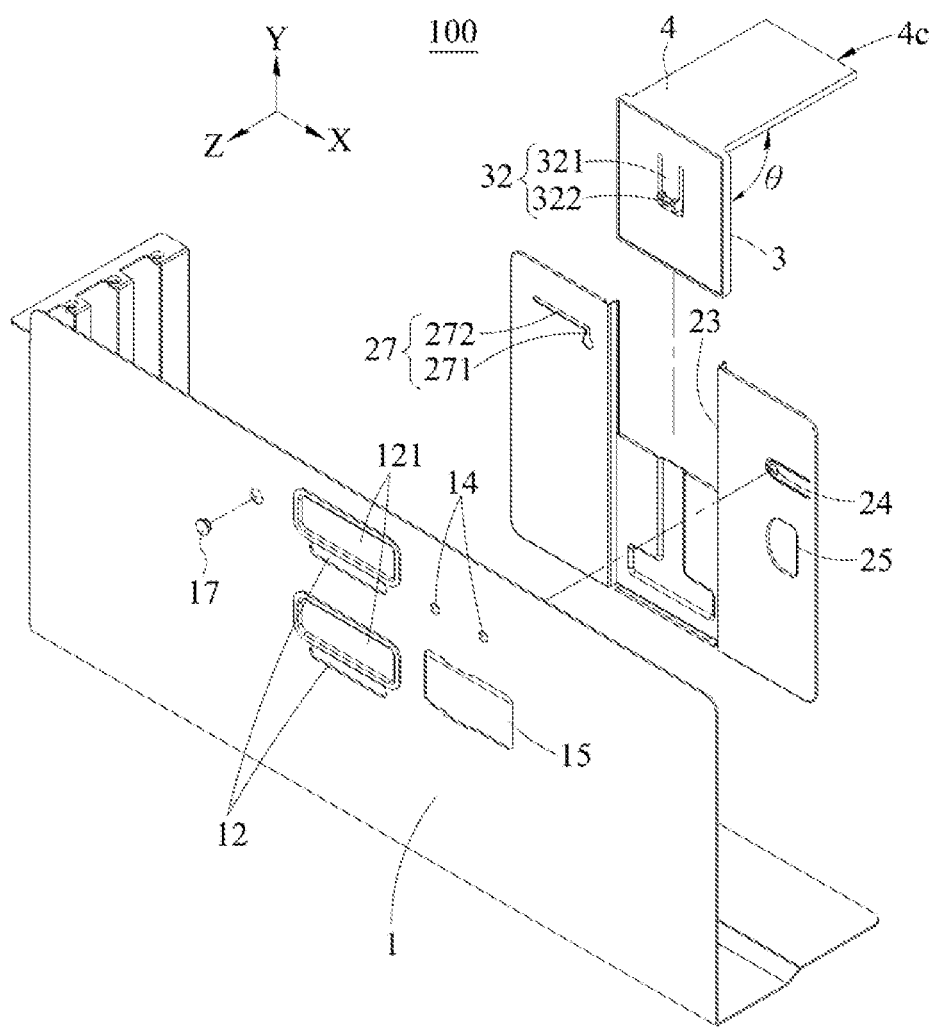
FIG. 27 illustrates a schematic exploded view of an extension mechanism according to some embodiments, showing another cooperation structure of a bracket, a carrier, a covering plate, and a slidable member.

In some embodiments, the through hole 11 of the bracket 1 corresponds to the elastic piece 21 of the carrier 2, and the elastic piece 21 is configured to be clamped to the through hole 11. In addition, the through hole 14 of the bracket 1 corresponds to the protrusion 24 of the carrier 2, and the protrusion 24 is configured to be clamped to the through hole 14. In some embodiments, the bracket 1 and the carrier 2 respectively include the through hole 11 and the elastic piece 21 without the through hole 14 and the protrusion 24. The elastic piece 21 is clamped to the through hole 11, so that the carrier 2 can be fixed to the bracket 1. In some embodiments, the bracket 1 and the carrier 2 respectively include the through hole 14 and the protrusion 24 without the through hole 11 and the elastic piece 21. The protrusion 24 is clamped to the through hole 14, so that the carrier 2 can be fixed to the bracket 1 (as shown in FIG. 27).

Referring to FIG. 3 again and with reference to FIG. 8 to FIG. 11B, in some embodiments, the bracket 1 includes a plurality of transverse groove holes 15 (or only one transverse groove hole 15 may be disposed), the transverse groove hole 15 is adjacent to the first buckling portion 11, and the carrier 2 includes a moving portion 25 corresponding to the transverse groove hole 15. When a user wants to move the carrier 2 from the first position P1 to the second position P2, the user may press the stop sections 212 of the elastic pieces 21 on the right side (make the stop sections 212 to be separated from the through holes 11), and then the user may push the moving portion 25 on the left side to move right, so that the carrier 2 moves from the first position P1 and the second position P2. Then, when pushing the carrier 2 to move from the second position P2 to the first position P1, the user may press the stop sections 212 of the elastic pieces 21 on the left side (make the stop sections 212 to be separated from the through holes 11), and then the user may push the moving portion 25 on the right side to move left, so that the carrier 2 moves from the second position P2 and the first position P1.

In some embodiments, the carrier 2 has the fastening portion 21 and the docking portion 24 at the same time, and the bracket 1 has the first buckling portion 11 and the positioning portion 14 at the same time. The first buckling portion 11 corresponds to the fastening portion 21, and the positioning portion 14 corresponds to the docking portion 24, so that the carrier 2 moves on the first axis X relative to the bracket 1. In addition, the slide portion 27 of the carrier 2 corresponds to the limiting member 17 of the bracket 1, and the arrangement of the slide portion 27 and the limiting member 17 provides a combined path for the carrier 2 and the bracket 1 in the entering section 271 of the slide portion 27, in addition to providing movement of the carrier 2 on the first axis X relative to the bracket 1. A length of the translating section 272 of the slide portion 27 is greater than or equal to a distance between two adjacent first buckling portions 11, and a length of the translating section 272 is greater than or equal to a distance between two adjacent positioning portions 14. In some embodiments, the carrier 2 includes one of the fastening portion 21 and the docking portion 24, and the bracket 1 includes the first buckling portion 11 or the positioning portion 14 corresponding to the carrier 2.

Referring to FIG. 3 and FIG. 8 to FIG. 11B together, in some embodiments, each second buckling portion 12 is a through hole or a groove (the following uses a groove 12 as an example for description, and the groove is marked as the same as the second buckling portion 12). The groove 12 has a length, a hook portion 32 moves by the length in the groove 12, and the length corresponds to the distance between the first position P1 and the second position P2.

When a user wants to move the hook portion 32 to a left side of the groove 12, a left side surface of the hook portion 32 is substantially in contact with a left inner wall surface of the groove 12. When the user wants to move the hook portion 32 to a right side of the groove 12, a right side surface of the hook portion 32 is substantially in contact with a right inner wall surface of the groove 12. The length is a distance from a center of the hook portion 32 at a left side position of the groove 12 to a center of the hook portion 32 at a right side position of the groove 12.

Referring to FIG. 3 and FIG. 8 to FIG. 11B together, in some embodiments, the bracket 1 includes two longitudinal groove holes 121, and the hook portion 32 includes an elastic arm 321 and a hook part 322 formed at an end portion of the elastic arm 321. The hook part 322 is selectively clamped to one of two grooves 12, and the elastic arm 321 is selectively located at one of the two longitudinal groove holes 121. In addition, the carrier 2 is a concave portion (the following uses a concave portion 231 as an example for description), and the concave portion 231 is located at an inner side of the sliding groove 23 for movement of the elastic arm 321. The structure of the concave portion 231 is designed on the carrier 2 to improve the strength.

When a user wants the slidable member 3 located at the third position P3 (as shown in FIG. 14), the hook part 322 is clamped to the groove 12 on the upper side, and the elastic arm 321 is located in the longitudinal groove hole 121 on the upper side. When a user wants to move the slidable member 3 from the third position P3 to the fourth position P4 (the slidable member 3 shown in FIG. 14 moves downward to a position of the slidable member 3 shown in FIG. 15), first, the user presses the elastic arm 321 in the longitudinal groove hole 121 on the upper side, the elastic arm 321 swings to the concave portion 231, and the elastic arm 321 swings and drives the hook part 322 to be separated from the groove 12 on the upper side. Then, when the user wants to move the slidable member 3 to the fourth position P4 (as shown in FIG. 15), the hook part 322 is clamped to the groove 12 on the lower side, and the elastic arm 321 is located in the longitudinal groove hole 121 on the lower side. When the user wants to move the slidable member 3 from the fourth position P4 back to the third position P3, the slidable member 3 can be moved upward from a lower position of FIG. 15 to an upper position of FIG. 14 following the operation described above.

In some embodiments, a movement range of the slidable member 3 on the second axis Y on the bracket 1 is within 40.25 mm to 44.25 mm, for example, but not limited to, 41.25 mm, 42.25 mm, or 43.25 mm. The movement range is the distance by which the slidable member 3 moves between the third position P3 and the fourth position P4.

Referring to FIG. 3, in some embodiments, the covering plate 4 is pivotally connected to the slidable member 3 as a two-piece member, but this application is not limited thereto. In some embodiments, the covering plate 4 and the slidable member 3 may be single assemblies (as shown in FIG. 27). There is an included angle θ between the covering plate 4 and the slidable member 3, and the included angle θ may range from 70 degrees to 100 degrees. In some embodiments, the covering plate 4 is substantially perpendicular to the slidable member 3.

Figure 12:
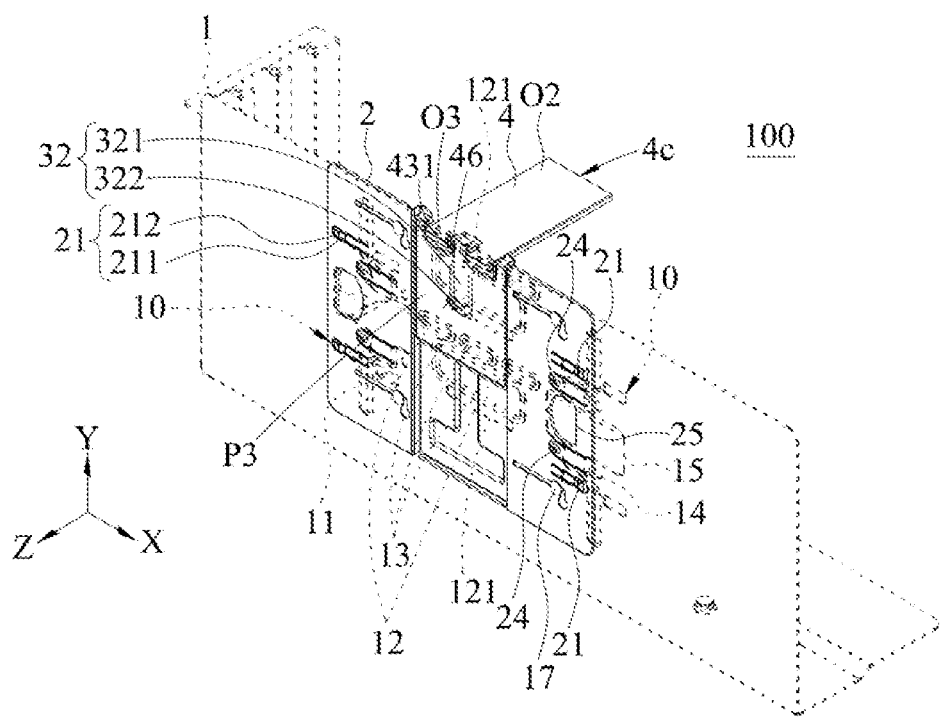
FIG. 12 illustrates a schematic appearance diagram of an extension mechanism according to some embodiments, showing a state that a slidable member is located at a third position P3, where a bracket is shown in a dashed line.
Figure 13:
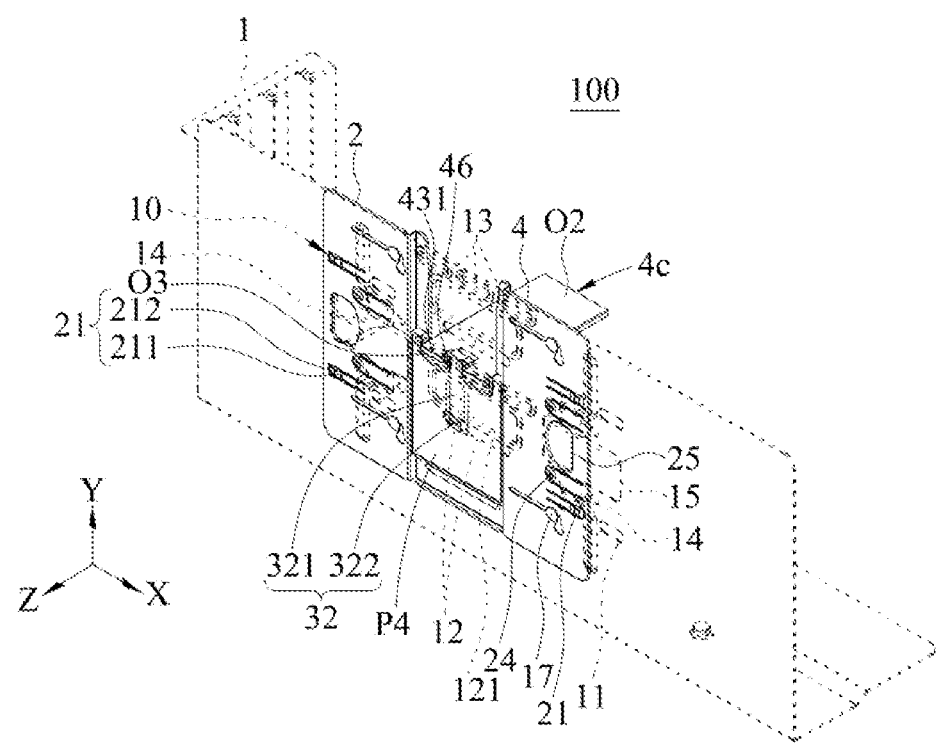
FIG. 13 illustrates a schematic appearance diagram of an extension mechanism according to some embodiments, showing a state that a slidable member is located at a fourth position P4, where a bracket is shown in a dashed line.

Referring to FIG. 3, and with reference to FIG. 12 to FIG. 15, FIG. 12 is a schematic appearance diagram of an extension mechanism 100 according to some embodiments, showing a state that a slidable member 3 is located at a third position P3, where a bracket 1 is shown in a dashed line; FIG. 13 is a schematic appearance diagram of an extension mechanism 100 according to some embodiments, showing a state that a slidable member 3 is located at a fourth position P4, where a bracket is shown in a dashed line; FIG. 14 is a schematic rear view of a bracket 1 and a carrier 2 according to some embodiments, showing a state that a slidable member 3 is located at a third position P3; and FIG. 15 is a schematic rear view of a bracket 1 and a carrier 2 according to some embodiments, showing a state that a slidable member 3 is located at a fourth position P4. The following describes the embodiment in which the slidable member 3 and the covering plate 4 are a two-piece member (as shown in FIG. 3), a pivot edge 4a of the covering plate 4 is pivotally connected to a first edge 3a of the slidable member 3, so that the covering plate 4 can pivot between an open position O1 and a folding position O2. In some embodiments, as shown in FIG. 14 and FIG. 15, the covering plate 4 is located at the open position O1, and the covering plate 4 is substantially parallel to the slidable member 3. As shown in FIG. 12 and FIG. 13, the covering plate 4 is located at the folding position O2, and the covering plate 4 is substantially perpendicular to the slidable member 3. When the covering plate 4 is substantially parallel to the slidable member 3 (that is, the covering plate 4 is located at the open position O1), the user can mount the extension module 300 on the bracket 1. After the extension module 300 is mounted, the user can rotate the covering plate 4 to the folding position O2, and the covering plate 4 is located adjacent the top of the extension module 300.

Figure 17:
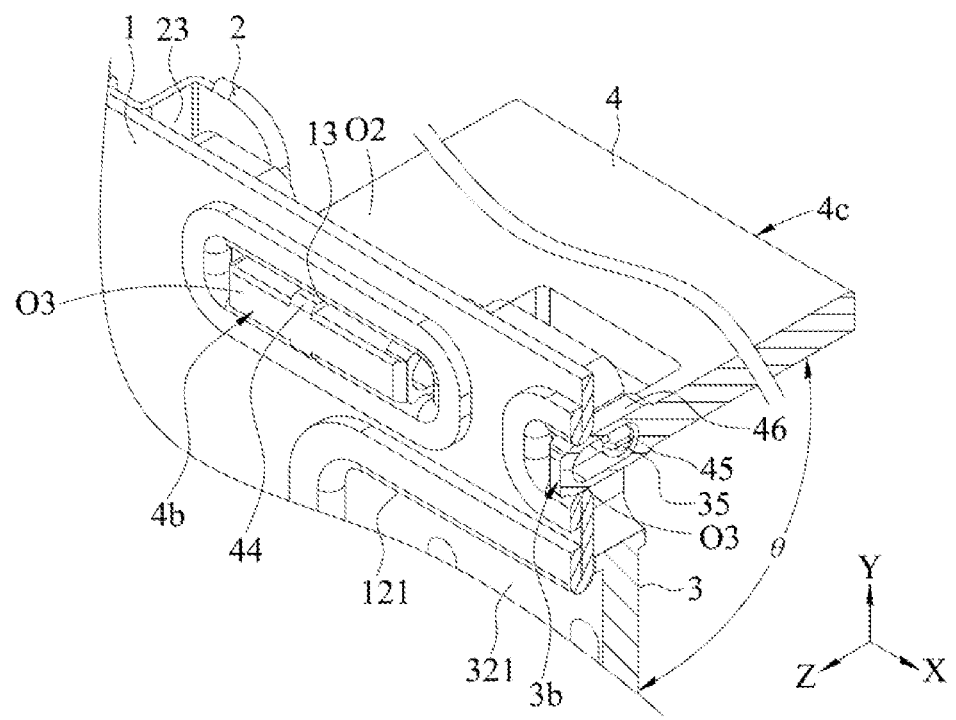
FIG. 17 illustrates a schematic partial cross-sectional view of an appearance of a covering plate and a bracket according to some embodiments, showing a state that the covering plate is located at a clamping position.
Figure 20:
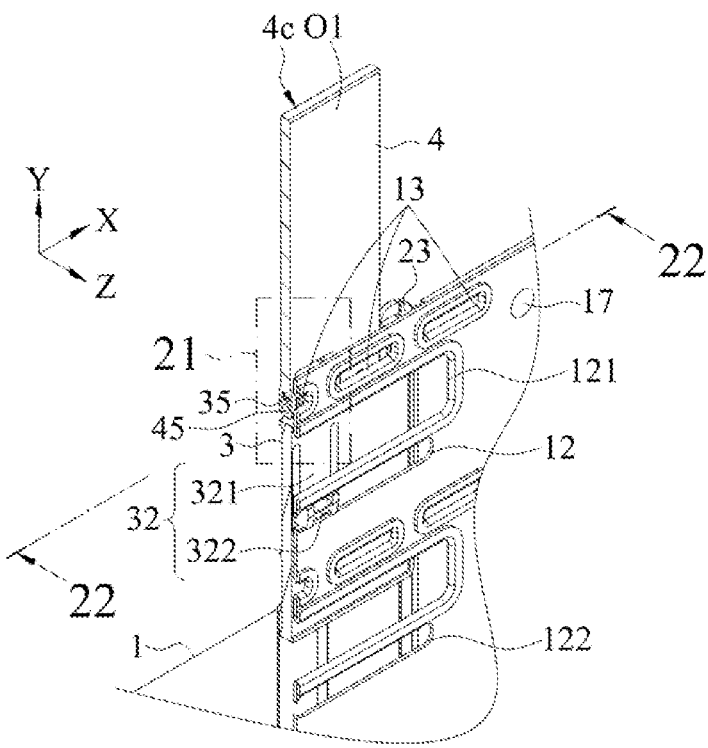
FIG. 20 illustrates a schematic partial cross-sectional view of an appearance of a covering plate and a slidable member according to some embodiments, where the covering plate is located at a non-rotation position.
Figure 21:
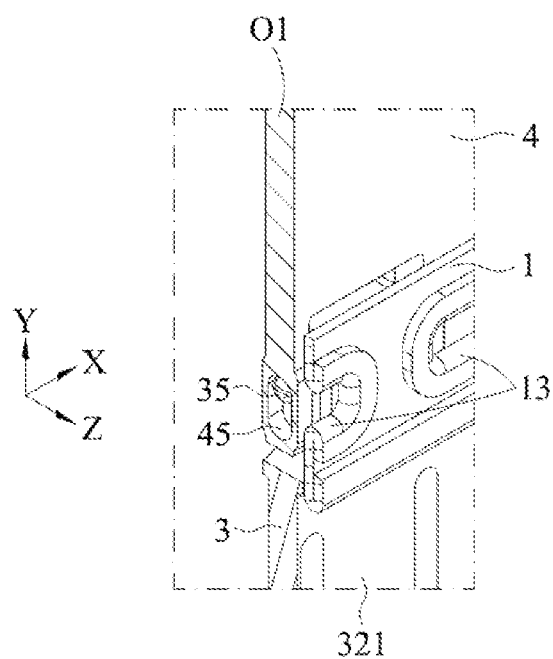
FIG. 21 illustrates a schematic partial cross-sectional view of an appearance of a center line frame marked with 21 in FIG. 20.

Referring to FIG. 3, FIG. 16, and FIG. 17 together, FIG. 16 is a schematic partial cross-sectional view of an appearance of a covering plate 4 and a bracket 1 according to some embodiments, showing a state that the covering plate 4 is located at a folding position O2; and FIG. 17 is a schematic partial cross-sectional view of an appearance of a covering plate 4 and a bracket 1 according to some embodiments, showing a state that the covering plate 4 is located at a clamping position O3. In some embodiments, a connecting side 4b of the covering plate 4 is connected to a first side 3b of the slidable member 3 in a pivoting-sliding manner, so that the covering plate 4 pivots between the open position O1 and the folding position O2 (as shown in FIG. 16) and moves between the folding position O2 and a clamping position O3 (as shown in FIG. 17). When the covering plate 4 is located at the open position O1, the covering plate 4 is substantially parallel to the slidable member 3, and one surface of the covering plate 4 approaches, is in contact with, or abuts against the bracket 1. Therefore, the bracket 1 provides an effect of stopping at the open position O1 after the covering plate 4 rotates (stopping at the open position O1 after the covering plate 4 rotates, as shown in FIG. 20 and FIG. 21).

Referring to FIG. 3, FIG. 16, and FIG. 17 together, in some embodiments, the covering plate 4 includes a pivot portion 45. In some embodiments, the pivot portion 45 is a rectangular shaft hole and the slidable member 3 has a rotary shaft portion 35 pivotally connected to the pivot portion 45. In some embodiments, the rotary shaft portion 35 is a convex shaft. Through the connection relationship between the rotary shaft portion 35 and the pivot portion 45, the covering plate 4 and the slidable member 3 can move along the second axis Y when the covering plate 4 is located at the folding position O2, and can move along the third axis Z when the covering plate 4 is located at the open position O1. In some embodiments, the rotary shaft portion 35 has a chamfer, to facilitate assembly and cooperation between the rotary shaft portion 35 and the pivot portion 45. That the covering plate 4 includes a shaft hole and the slidable member 3 has a convex shaft are merely examples. In some embodiments, the covering plate 4 may include a convex shaft and the slidable member 3 may have a shaft hole. In some embodiments, a convex shaft surface of the rotary shaft portion 35 is in loose fit with the shaft hole of the pivot portion 45, to provide friction of the covering plate 4 during rotation with an appropriate effect of stopping positioning.

The connection relationship of the pivoting-sliding manner is a connection manner that enables the two assemblies to have a mutually pivotable relationship and a mutual axis movable relationship. The clamping position O3 (as shown in FIG. 17) is a position at which the connecting side 4b of the covering plate 4 is clamped on the bracket 1. When the covering plate 4 is located at the clamping position O3, between the covering plate 4 and the slidable member 3 create an included angle θ. The covering plate 4 and the slidable member 3 cannot pivot with each other. When the covering plate 4 pivots from the open position O1 toward the folding position O2 and is positioned at the folding position O2, the covering plate 4 may be located adjacent the top of the extension module 300. In some embodiments, a small gap is formed between the bottom of the covering plate 4 and the top of the extension module 300 to avoid friction, then, when the covering plate 4 is moved to the clamping position O3, the covering plate 4 is clamped to the bracket 1 to be stably positioned, and the covering plate 4 can be located adjacent the top of the extension module 300, so that the covering plate 4 can limit the degree of freedom of the top of the extension module 300 and prevent the extension module 300 from loosening or dropping.

Figure 18:
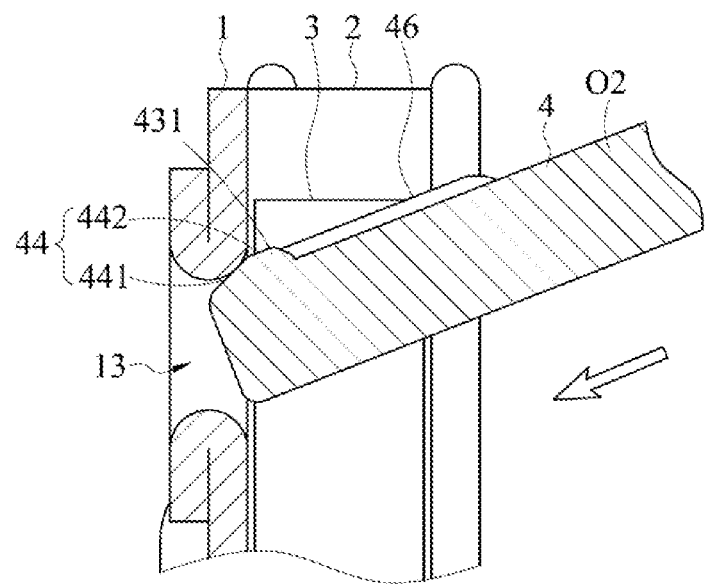
FIG. 18 illustrates a schematic partial cross-sectional side view of a covering plate and a bracket according to some embodiments, showing a state when the covering plate and the bracket are assembled.
Figure 19:
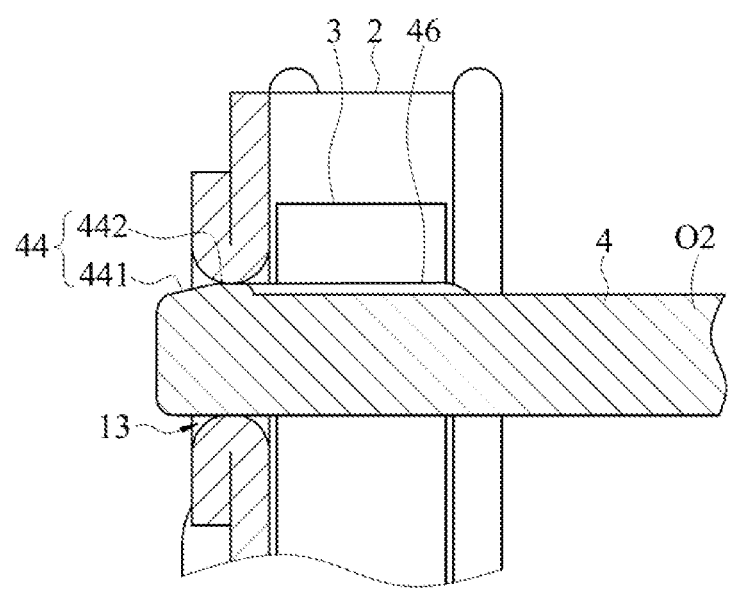
FIG. 19 illustrates a schematic partial cross-sectional side view of a covering plate and a bracket according to some embodiments, showing a state after the covering plate and the bracket are assembled.

Referring to FIG. 3, FIG. 18, and FIG. 19 together, FIG. 18 is a schematic partial cross-sectional side view of a covering plate 4 and a bracket 1 according to some embodiments, showing a state when the covering plate 4 and the bracket 1 are assembled; and FIG. 19 is a schematic partial cross-sectional side view of a covering plate 4 and a bracket 1 according to some embodiments, showing a state after the covering plate 4 and the bracket 1 are assembled. In some embodiments, a clamping portion 43 has a bump 431, but this application is not limited thereto. When the clamping portion 43 is located in a clamping hole 13, the bump 431 is in contact with the inner side of the clamping hole 13. In some embodiments, the clamping portion 43 and the clamping hole 13 are in a close-fitting relationship, to improve stability of clamping of the covering plate 4 between the brackets 1 and limit the degree of freedom of movement of the extension module 300 when the extension module 300 is vibrated. Referring to FIG. 3, FIG. 16, and FIG. 17 together, in some embodiments, the clamping portion 43 has bumps 431 on the upper and lower surfaces of the covering plate 4, each bump 431 is in contact with the inner wall of each clamping hole 13, so that the covering plate 4 is substantially perpendicular to the slidable member 3.

In some embodiments, the bump 431 has a guide surface 44, and the guide surface 44 is configured to guide the clamping portion 43 of the covering plate 4 to enter the clamping hole 13. A front section and a rear section of the guide surface 44 are respectively provided with an inclined section 441 and a horizontal section 442, the inclined section 441 is configured to guide the clamping portion 43 to obliquely enter the clamping hole 13, and the horizontal section 442 is configured to guide the clamping portion 43 to vertically enter the clamping hole 13.

When the covering plate 4 is obliquely docked toward the bracket 1, the inclined section 441 on the clamping portion 43 is first in contact with the inner wall (a circular arc wall surface) of the clamping hole 13, the covering plate 4 inclines but the bottom of the covering plate 4 is not in contact with the top of the extension module 300, after the covering plate 4 is inserted into the bracket 1 with continuous application of force, the horizontal section 442 on the clamping portion 43 is in contact with the inner wall of the clamping hole 13, the covering plate 4 is provided to be aligned and substantially perpendicular to the bracket 1, and the bottom of the covering plate 4 is close to the top of the extension module 300. The clamping portion 43 is inserted into the clamping hole 13 to be positioned, so that the covering plate 4 can be stably positioned on the bracket 1, and the covering plate 4 can limit the degree of freedom of the top of the extension module 300 and prevent the extension module 300 from loosening or dropping during vibration.

Figure 22:
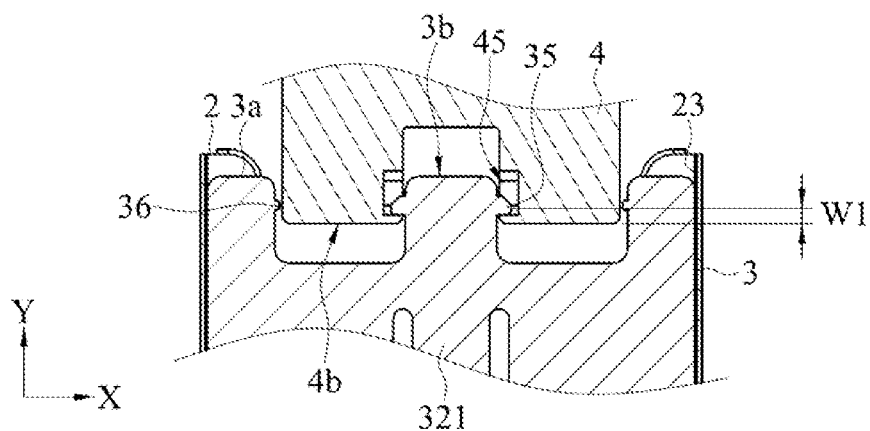
FIG. 22 illustrates a schematic partial cross-sectional view of a position 22-22 in FIG. 20, showing that a covering plate is parallel to a slidable member and the covering plate is located at a rotatable position.
Figure 23:
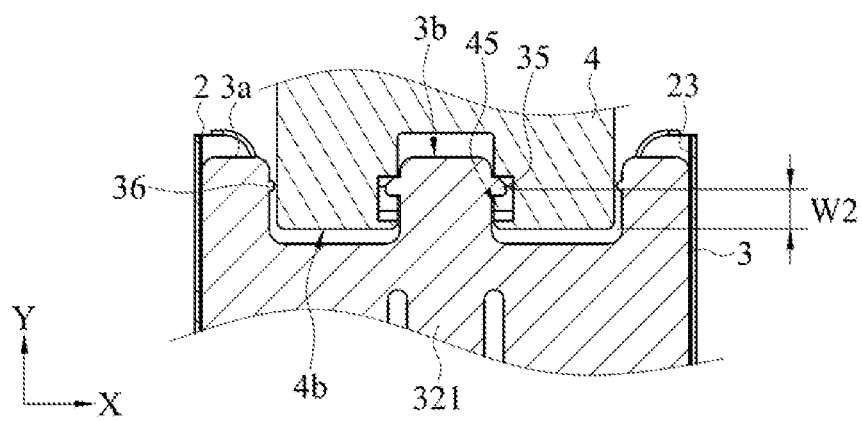
FIG. 23 illustrates a schematic partial cross-sectional view from the same perspective as FIG. 22, showing that the covering plate is located at a non-rotation position.

Referring to FIG. 3, FIG. 22, and FIG. 23 together, FIG. 22 illustrates a schematic partial cross-sectional view of a position 22-22 in FIG. 20, showing that a covering plate 4 is parallel to a slidable member 3 and the covering plate 4 is located at a rotatable position; and FIG. 23 illustrates a schematic partial cross-sectional view from the same perspective as FIG. 22, showing that a covering plate 4 is located at a non-rotation position. In some embodiments, the covering plate 4 is parallel to the slidable member 3 (as shown in FIG. 22) when the covering plate 4 is located at the open position O1. When the convex shaft of the rotary shaft portion 35 is on one side of the pivot portion 45 (the shaft hole), a first distance W1 between the connecting side 4b of the covering plate 4 and the rotary shaft portion 35 is relatively short. Therefore, the connecting side 4b does not collide with the bracket 1 when the covering plate 4 rotates. When the covering plate 4 is pushed downward along the second axis Y, the shaft (the convex shaft) of the rotary shaft portion 35 is located on the other side of the pivot portion 45 (the shaft hole) (as shown in FIG. 23). In this case, a second distance W2 between the connecting side 4b and the rotary shaft portion 35 is relatively long, and when a user wants to rotate the covering plate 4, the connecting side 4b is in contact with the bracket 1 and the covering plate 4 cannot be rotated, that is, at the position of FIG. 23, the covering plate 4 cannot be rotated.

Referring to FIG. 3 again, in some embodiments, the connecting side 4b of the covering plate 4 has two clamping portions 43, the bracket 1 has six clamping holes 13, the three clamping holes 13 on the upper side are arranged side by side along the first axis X (hereinafter referred to as a first group), and the three clamping holes 13 on the lower side are arranged side by side along the first axis X (hereinafter referred to as a second group). The first group of the three clamping holes 13 and the corresponding second group of the three clamping holes 13 are arranged in vertical alignment along the second axis Y.

When the carrier 2 is selectively located at the first position P1 or the second position P2, the clamping portion 43 is selectively and separately clamped to two of the first group of the three clamping holes 13. When the slidable member 3 is selectively located at the third position P3 or the fourth position P4, the clamping portion 43 is selectively and separately clamped to two of the second group of the three clamping holes 13. Through the arrangement that the six clamping holes 13 correspond to the four clamping portions 43, the covering plate 4 can be stably fixed on the bracket 1, thereby providing an effect of limiting the degree of freedom of movement of the extension modules 300 with four different sizes.

When the clamping portion 43 of the covering plate 4 is separated from the clamping hole 13, and the covering plate 4 is located at the folding position O2, the slidable member 3 can move in a direction of the second axis Y. When the slidable member 3 is to be moved from the third position P3 to the fourth position P4, the covering plate 4 may be first pivoted to the open position O1, so that the covering plate 4 is parallel to the slidable member 3, and then the slidable member 3 is pushed downward, so that the slidable member 3 moves from the third position P3 to the fourth position P4.

Referring to FIG. 3 again, in some embodiments, the connecting side 4b of the covering plate 4 has two buckling blocks, the first side 3b of the slidable member 3 forms two docking areas, and the buckling blocks of the covering plate 4 match concave-convex structures of the docking areas of the slidable member 3 and the buckling blocks of the covering plate 4 are connected to the concave-convex structures of the docking areas of the slidable member 3 in a pivoting-sliding manner, but this application is not limited thereto. In some embodiments, the connecting side 4b of the covering plate 4 may form one buckling block, the first side 3b of the slidable member 3 may form one docking area (as shown in FIG. 24), and an extending block of the covering plate 4 matches a concave-convex structure of a concave area of the slidable member 3 and the extending block of the covering plate 4 is connected to the concave-convex structure of the concave area of the slidable member 3 in a pivoting-sliding manner.

Figure 24:
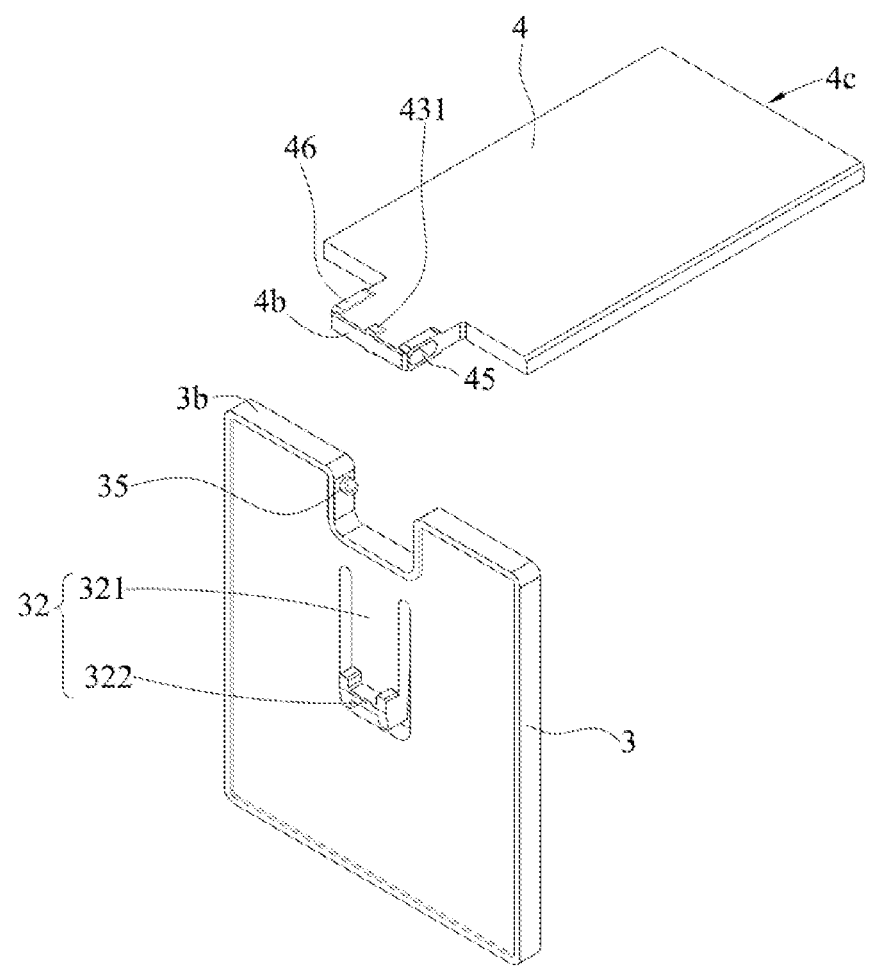
FIG. 24 illustrates a schematic appearance diagram of a covering plate and a slidable member according to some embodiments, showing another concave-convex structure of the covering plate and the slidable member.
Figure 25:
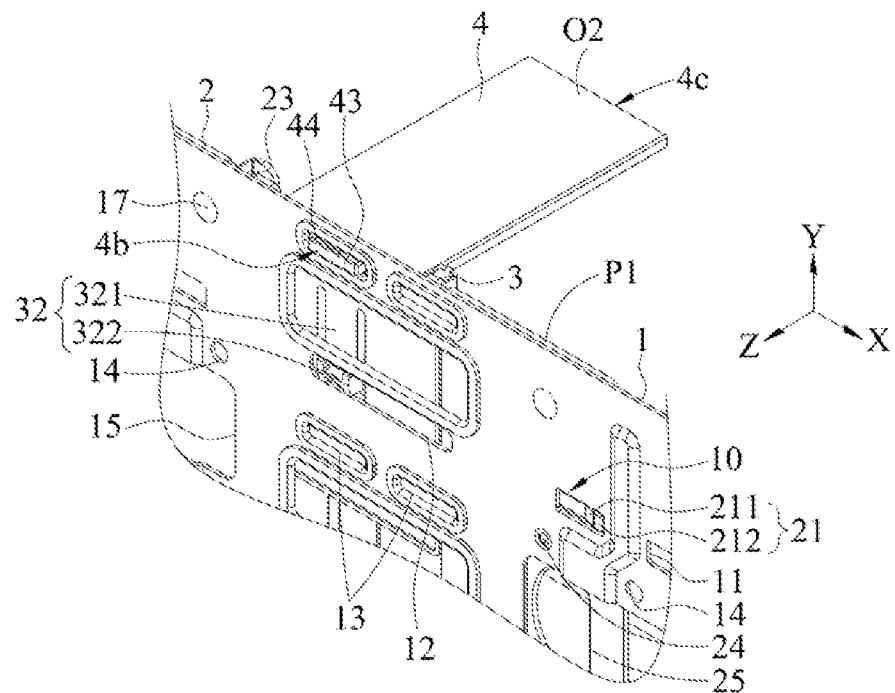
FIG. 25 illustrates a schematic partial appearance diagram of a covering plate and a slidable member according to some embodiments, showing a cooperation relationship of another concave-convex structure of the covering plate and the slidable member and a clamping state of the covering plate at a first position.
Figure 26:
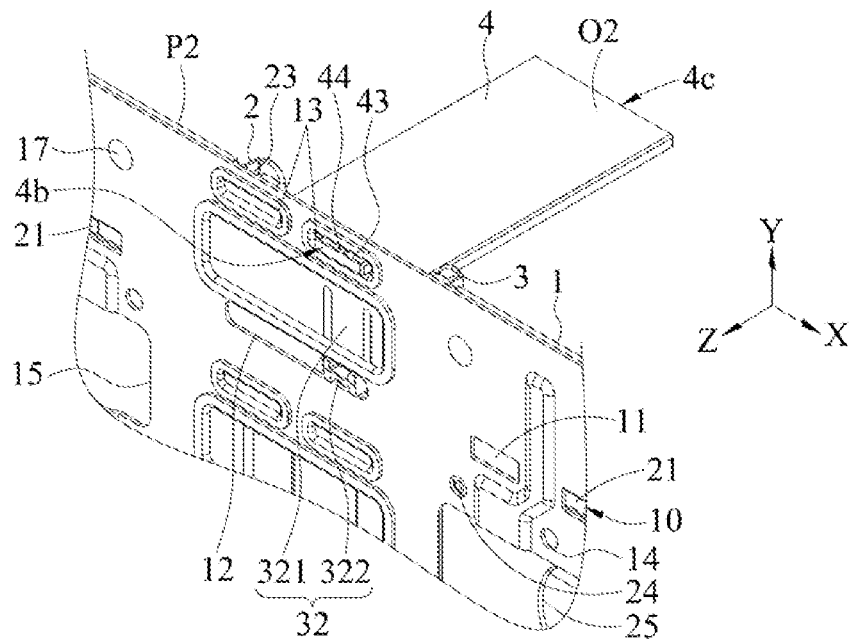
FIG. 26 illustrates a schematic partial appearance diagram of a covering plate and a slidable member according to some embodiments, showing a cooperation relationship of another concave-convex structure of the covering plate and the slidable member and a clamping state of the covering plate at a second position.

Referring to FIG. 3 and FIG. 24 to FIG. 26 together, FIG. 24 is a schematic appearance diagram of a covering plate 4 and a slidable member 3 according to some embodiments, showing another concave-convex structure of the covering plate 4 and the slidable member 3; FIG. 25 is a schematic partial appearance view of a covering plate 4 and a slidable member 3 according to some embodiments, showing a clamping state that the covering plate 4 of FIG. 24 is at a first position P1; and FIG. 26 is a schematic partial appearance view of a covering plate 4 and a slidable member 3 according to some embodiments, showing a clamping state that the covering plate 4 of FIG. 24 is at a second position P2. In some embodiments, the connecting side 4b of the covering plate 4 may have one clamping portion 43, the bracket 1 may have four clamping holes 13, a first group of two clamping holes 13 are arranged side by side along the first axis X, and a second group of two clamping holes 13 are arranged side by side along the first axis X. The first group of the two clamping holes 13 and the second group of the two clamping holes 13 are arranged in vertical alignment along the second axis Y.

When the carrier 2 is configured to move between the first position P1 (the carrier 2 is relatively located at a left side position of the bracket 1 shown in FIG. 25) and the second position P2 (the carrier 2 is relatively located at a right side position of the bracket 1 shown in FIG. 26) along the first axis X relative to the bracket 1, one clamping portion 43 of the covering plate 4 is selectively clamped to one of the first group of the two clamping holes 13 of the bracket 1. For example, as shown in FIG. 25, the clamping portion 43 is clamped to the clamping hole 13 at the upper left, and as shown in FIG. 26, the clamping portion 43 is clamped to the clamping hole 13 at the upper right. In some embodiments, when the slidable member 3 is configured to move from the third position P3 to the fourth position P4 along the second axis Y relative to the bracket 1 (not shown in the figure, reference is made to that the slidable member 3 shown in FIG. 14 moves from the third position P3 on the upper side to the fourth position P4 on the lower side shown in FIG. 15). When the carrier 2 moves between the first position P1 and the second position P2, one clamping portion 43 of the covering plate 4 is selectively clamped to one of the second group of the other two clamping holes 13 of the bracket 1 (not shown in the figure, for example, as shown in FIG. 25, the clamping portion 43 is clamped to the clamping hole 13 at the lower left, and as shown in FIG. 26, the clamping portion 43 is clamped to the clamping hole 13 at the lower right), to achieve an effect of stable positioning. Through the arrangement that four clamping holes 13 correspond to one clamping portion 43, the covering plate 4 can be stably fixed on the bracket 1, thereby providing an effect of limiting the degree of freedom of movement of the extension modules 300 with four different sizes.

Referring to FIG. 3, FIG. 22, and FIG. 23 together, in some embodiments, the first side 3b of the slidable member 3 has one or more convex points 36, and two convex points 36 are disposed on two sides of the first side 3b of the slidable member 3 corresponding to two side ends of the covering plate 4. When the covering plate 4 is connected to the first side 3b of the slidable member 3 in a pivoting-sliding manner, the rotary shaft portion 35 is limited in the pivot portion 45 at the center of the covering plate 4, and the convex points 36 are correspondingly located at the two side ends of the covering plate 4 and have a gap, to facilitate assembly and cooperation between the covering plate 4 and the slidable member 3.

Referring to FIG. 3, FIG. 16, and FIG. 17 together, in some embodiments, each of the upper surface and the lower surface of the covering plate 4 has a reinforcing block 46. The reinforcing blocks 46 are respectively and correspondingly located at the peripheries of the pivot portions 45. The pivot portion 45 is a rectangular shaft hole, so that a wall thickness of the periphery of the shaft hole is reduced, and the reinforcing blocks 46 are configured to increase the wall thickness of the periphery of each pivot portion 45, to enhance a structural effect.

Figure 29:
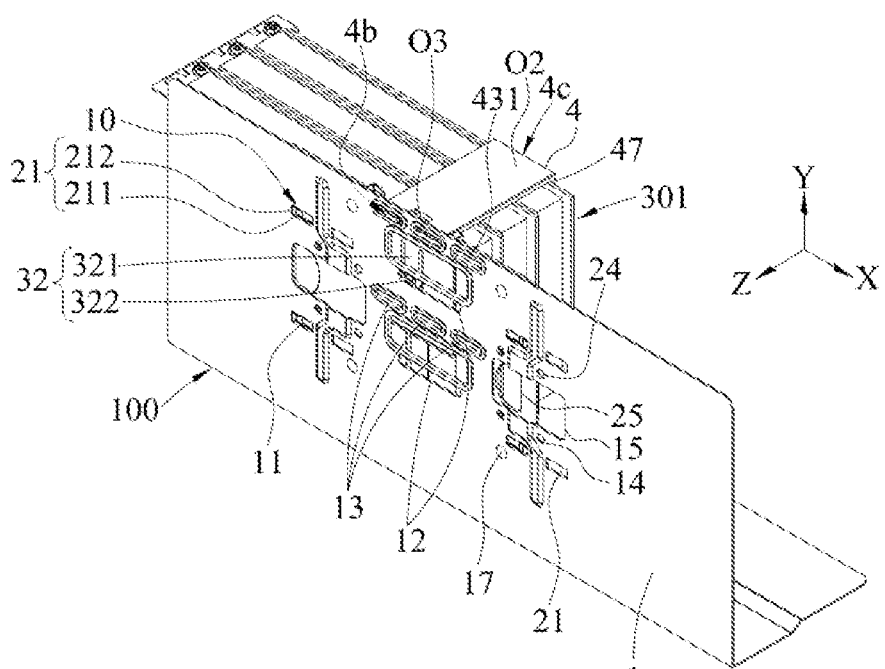
FIG. 29 illustrates a schematic appearance diagram of an extension mechanism according to some embodiments, where a carrier is located at a first position, a slidable member is located at a third position, and a covering plate is located adjacent the top of an extension card of an FHHL standard.

Referring to FIG. 3 and FIG. 29 together, in some embodiments, a free side 4c of the covering plate 4 has a bent portion 47, and the bent portion 47 extends along the second axis Y. After the extension module 300 is mounted on the bracket 1, the bent portion 47 is located at an outermost side of the extension module 300, and limits the degree of freedom of a side of the extension module 300, to prevent the extension module from loosening or dropping.

Figure 28:
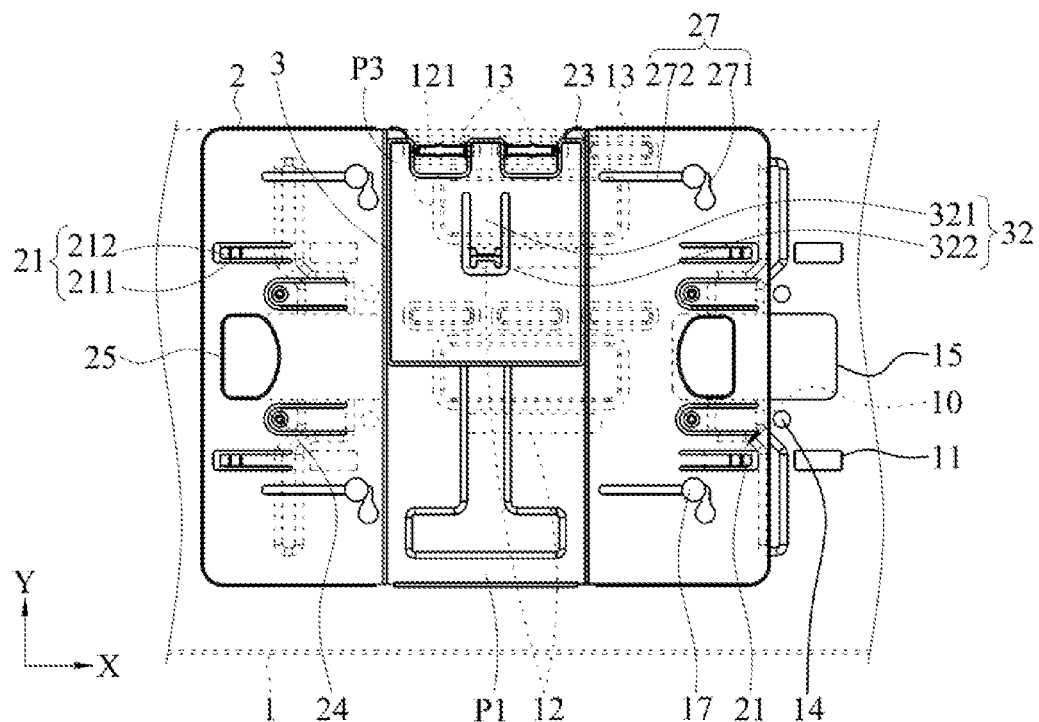
FIG. 28 illustrates a schematic rear view of a bracket and a carrier according to some embodiments, where the carrier is located at a first position, a slidable member is located at a third position, and a covering plate is located adjacent the top of an extension card of an FHHL standard.
Figure 30:
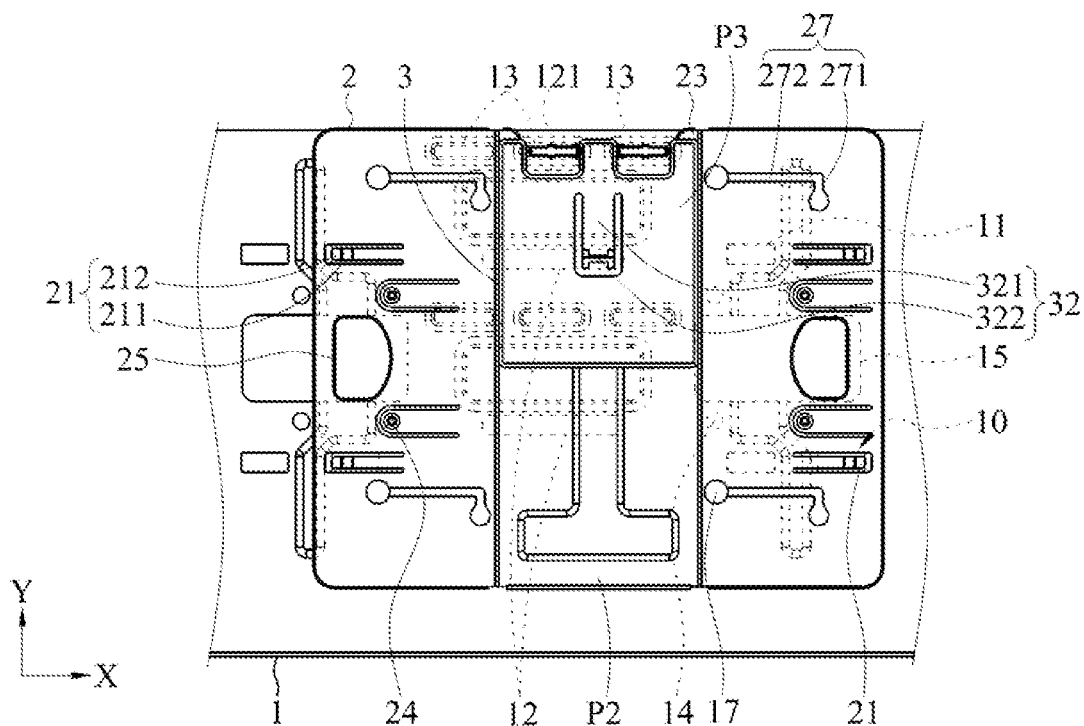
FIG. 30 illustrates a schematic rear view of a bracket and a carrier according to some embodiments, where the carrier is located at a second position, a slidable member is located at a third position, and a covering plate is located adjacent the top of an extension card of an FHFL standard.
Figure 31:
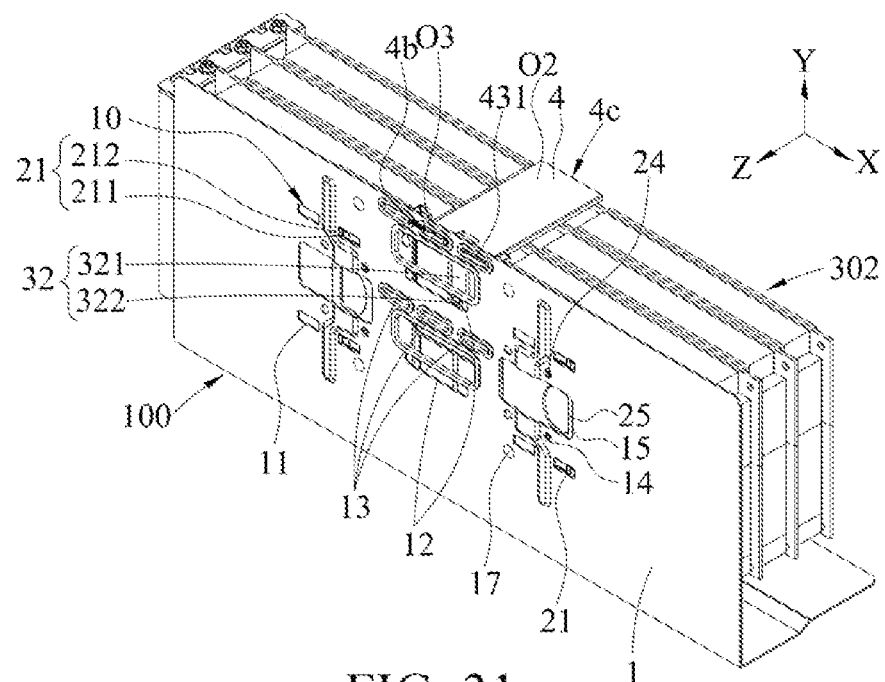
FIG. 31 illustrates a schematic appearance diagram of an extension mechanism according to some embodiments, where a carrier is located at a second position, a slidable member is located at a third position, and a covering plate is located adjacent the top of an extension card of an FHHL standard.
Figure 32:
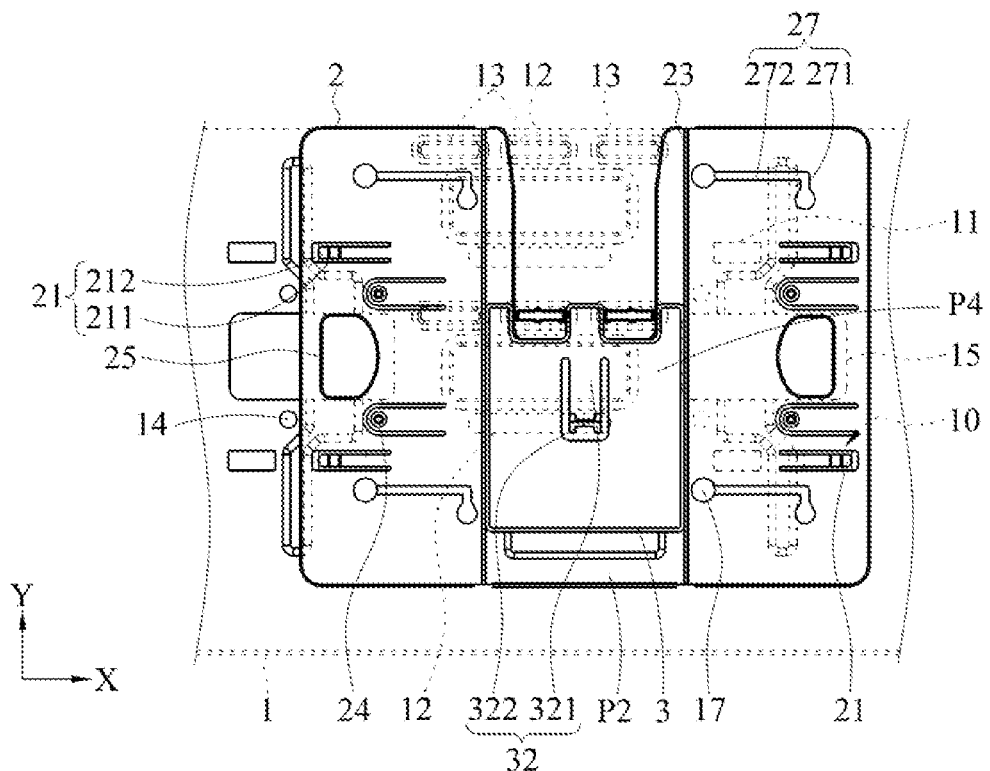
FIG. 32 illustrates a schematic rear view of a bracket and a carrier according to some embodiments, where the carrier is located at a first position, a slidable member is located at a fourth position, and a covering plate is located adjacent the top of an extension card of an HHHL standard.
Figure 33:
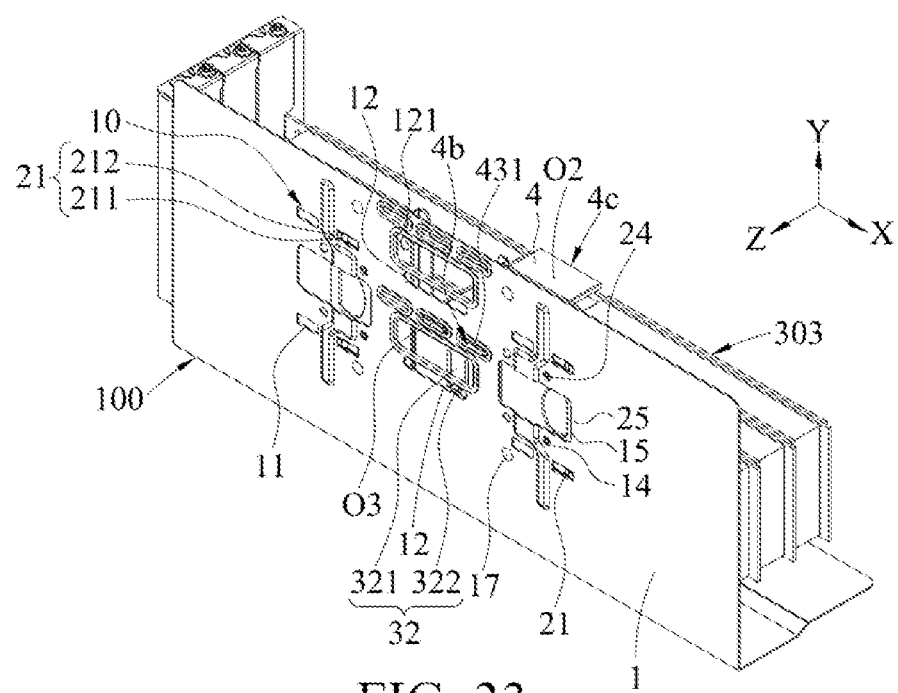
FIG. 33 illustrates a schematic appearance diagram of an extension mechanism according to some embodiments, where a carrier is located at a first position, a slidable member is located at a fourth position, and a covering plate is located adjacent the top of an extension card of an HHHL standard.
Figure 34:
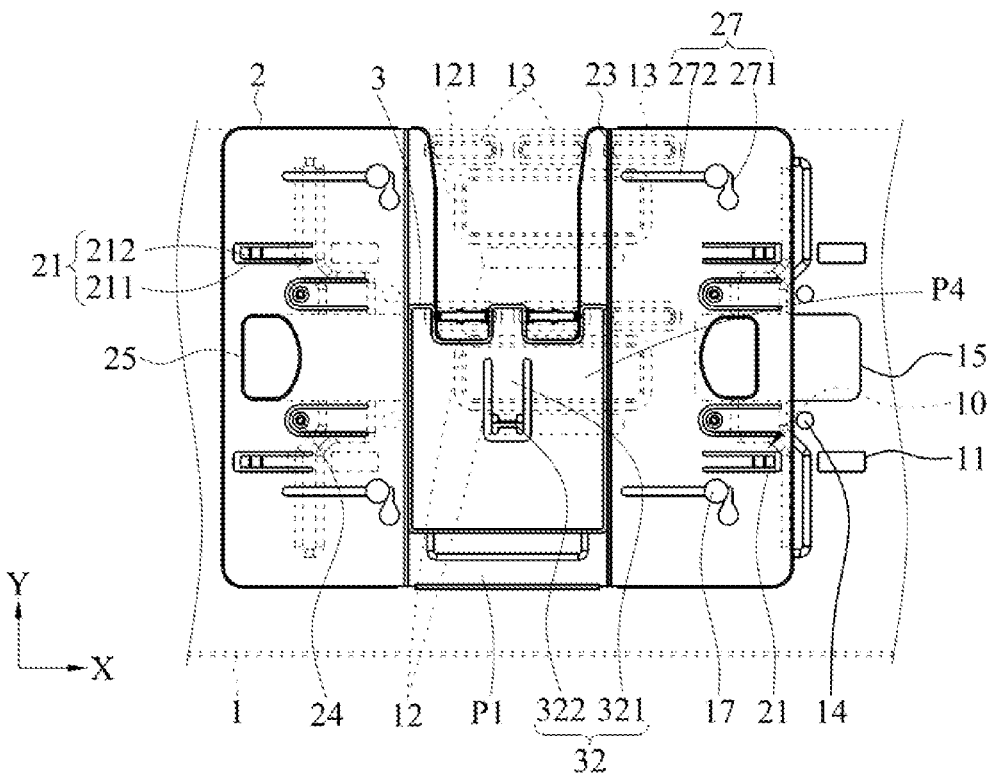
FIG. 34 illustrates a schematic rear view of a bracket and a carrier according to some embodiments, where the carrier is located at a second position, a slidable member is located at a fourth position, and a covering plate is located adjacent the top of an extension card of an HHFL standard.
Figure 35:
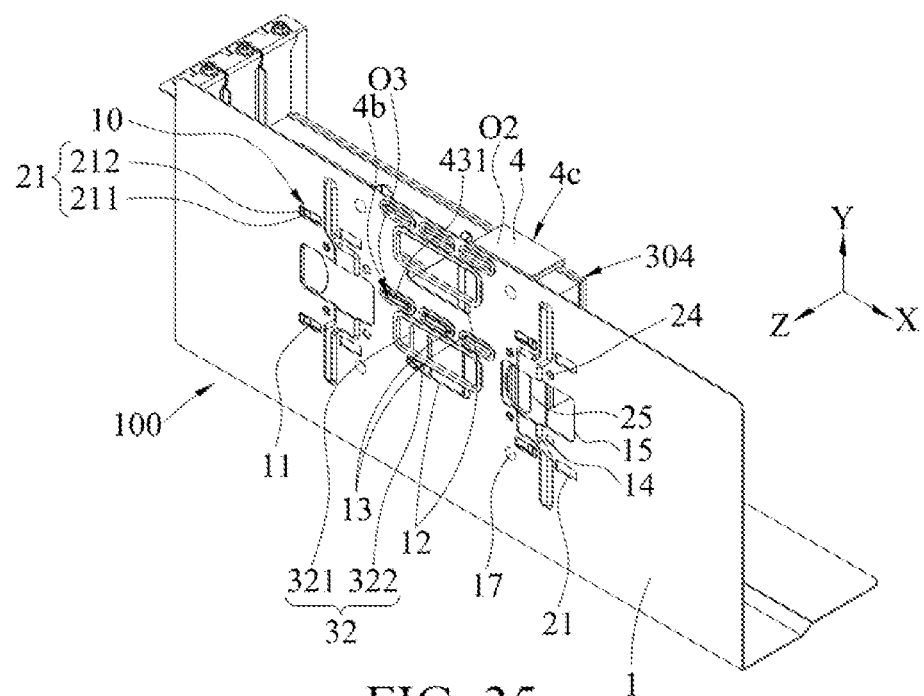
FIG. 35 illustrates a schematic appearance diagram of an extension mechanism according to some embodiments, where a carrier is located at a second position, a slidable member is located at a fourth position, and a covering plate is located adjacent the top of an extension card of an HHFL standard.

Referring to FIG. 28 to FIG. 34 together, FIG. 28 is a schematic rear view of a bracket 1 and a carrier 2 according to some embodiments, where the carrier 2 is located at a first position P1, the slidable member 3 is located at a third position P3, and the covering plate 4 is located adjacent the top of an extension module 301 of an FHHL standard; FIG. 29 is a schematic appearance diagram of an extension mechanism 100 according to some embodiments, where the carrier 2 is located at the first position P1, the slidable member 3 is located at the third position P3, and the covering plate 4 is located adjacent the top of the extension module 301 of the FHHL standard; FIG. 30 is a schematic rear view of a bracket 1 and a carrier 2 according to some embodiments, where the carrier 2 is located at the second position P2, the slidable member 3 is located at the third position P3, and the covering plate 4 is located adjacent the top of an extension module 302 of an FHFL standard; FIG. 31 is a schematic appearance diagram of an extension mechanism 100 according to some embodiments, where the carrier 2 is located at the second position P2, the slidable member 3 is located at the third position P3, and the covering plate 4 is located adjacent the top of the extension module 302 of the FHFL standard; FIG. 32 is a schematic rear view of a bracket 1 and a carrier 2 according to some embodiments, where the carrier 2 is located at the first position P1, the slidable member 3 is located at the fourth position P4, and the covering plate 4 is located adjacent the top of an extension module 303 of an HHHL standard; FIG. 33 is a schematic appearance diagram of an extension mechanism 100 according to some embodiments, where the carrier 2 is located at the first position P1, the slidable member 3 is located at the fourth position P4, and the covering plate 4 is located adjacent the top of the extension module 303 of the HHHL standard; FIG. 34 is a schematic rear view of a bracket 1 and a carrier 2 according to some embodiments, where the carrier 2 is located at the second position P2, the slidable member 3 is located at the fourth position P4, and the covering plate 4 is located adjacent the top of an extension module 304 of an HHFL standard; and FIG. 35 is a schematic appearance diagram of an extension mechanism 100 according to some embodiments, where the carrier 2 is located at the second position P2, the slidable member 3 is located at the fourth position P4, and the covering plate 4 is located adjacent the top of the extension module 304 of the HHFL standard.

In some embodiments, a peripheral size of an extension card (PCIe card) is classified as four cases, respectively full-height half-length (FHHL), full-height full-length (FHFL), half-height half-length (HHHL), and half-height full-length (HHFL) according to the peripheral component interconnect express (PCI Express) standard. The FHHL is a full-height half-length PCIe card, the FHFL is a full-height full-length PCIe card, the HHHL is a half-height half-length PCIe card, and the HHFL is a half-height full-length PCIe card. The half length is 162.57 [6.400] DIM "L", 167.65 MAX [6.600] DIM "M", and the full length is 306.92 [12.083] DIM "L", 312.00 MAX [12.283] DIM "M".

Referring to FIG. 28 and FIG. 29 together, when the carrier 2 is configured to move to the first position P1 along the first axis X relative to the bracket 1, and the slidable member 3 is located at the sliding groove 23 and moves to the third position P3 along the second axis Y, the covering plate 4 is located adjacent the top of the extension module 301 of the FHHL standard, and the covering plate 4 is configured to limit the degree of freedom of the top of the extension module 301 of the FHHL standard, to prevent the extension module 301 of the FHHL standard from loosening or dropping when the extension module 301 is vibrated due to vibration drop test, transportation, artificial or natural factors.

Referring to FIG. 30 and FIG. 31 together, when the carrier 2 is configured to move to the second position P2 along the first axis X relative to the bracket 1, and the slidable member 3 is located at the sliding groove 23 and moves to the third position P3 along the second axis Y, the covering plate 4 is located adjacent the top of the extension module 302 of the FHFL standard, and the covering plate 4 is configured to limit the degree of freedom of the top of the extension module 302 of the FHFL standard, to prevent the extension module 302 of the FHFL standard from loosening or dropping when the extension module 302 is vibrated due to vibration drop test, transportation, artificial or natural factors.

Referring to FIG. 32 and FIG. 33 together, when the carrier 2 is configured to move to the second position P2 along the first axis X relative to the bracket 1, and the slidable member 3 is located at the sliding groove 23 and moves to the fourth position P4 along the second axis Y, the covering plate 4 is located adjacent the top of the extension module 303 of the HHHL standard, and the covering plate 4 is configured to limit the degree of freedom of the top of the extension module 303 of the HHHL standard, to prevent the extension module 303 of the HHHL standard from loosening or dropping when the extension module 303 is vibrated due to vibration drop test, transportation, artificial or natural factors.

Referring to FIG. 34 and FIG. 35 together, when the carrier 2 is configured to move to the first position P1 along the first axis X relative to the bracket 1, and the slidable member 3 is located at the sliding groove 23 and moves to the fourth position P4 along the second axis Y, the covering plate 4 is located adjacent the top of the extension module 304 of the HHFL standard, and the covering plate 4 is configured to limit the degree of freedom of the top of the extension module 304 of the HHFL standard, to prevent the extension module 304 of the HHFL standard from loosening or dropping when the extension module 304 is vibrated due to vibration drop test, transportation, artificial or natural factors.

In some embodiments, the movement adjustment of the carrier 2 on the first axis X may drive the covering plate 4 to limit half-length and full-length PCIe cards, and the movement adjustment of the slidable member 3 on the second axis Y may drive the covering plate 4 to limit half-height and full-height PCIe cards.

In conclusion, according to some embodiments, the covering plate of the extension mechanism is disposed on one side of an extension module of the bracket, and when the extension mechanism provided with the extension module is vibrated due to vibration drop test, transportation, artificial or natural factors, the covering plate can prevent the extension module from loosening or dropping. Then, according to some embodiments, the carrier may be positioned at two positions along the first axis, and the slidable member may be positioned at two positions along the second axis. Therefore, the covering plate has four positioning positions, that is, four different positioning sizes are formed between the covering plate and the bracket, so that a single mechanism provides positioning of extension modules of four standards, respectively full-height half-length (FHHL), full-height full-length (FHFL), half-height half-length (HHHL), or half-height full-length (HHFL), and the movement of the extension module can be limited. Furthermore, according to some embodiments, positioning sizes of the covering plate, the slidable member, the carrier, and the bracket may be changed without tools. In addition, according to some embodiments, the covering plate is pivotally connected to the slidable member, one side of the covering plate is clamped to the bracket, and the other side of the covering plate is fixed to the extension card, thereby achieving a lever labor-saving effect.

What is claimed is:

1. An extension mechanism, comprising:
   a bracket, comprising a plurality of first buckling portions and a plurality of second buckling portions, wherein a connecting line of the first buckling portions is parallel to a first axis, and a connecting line of the second buckling portions are parallel to a second axis;
   a carrier, comprising a fastening portion and a sliding groove, and configured to slidably, along the first axis, connect to the bracket, the fastening portion is configured to clamp one of the first buckling portions;
   a slidable member, comprising a hook portion, wherein the slidable member is configured to slidably, along the second axis, connect to the sliding groove, the hook portion is configured to clamp one of the second buckling portions, and a length of each of the second buckling portions on the first axis corresponds to a distance between the first position and the second position; and
   a covering plate, connected to the slidable member, wherein the covering plate and the slidable member create an included angle.

2. The extension mechanism according to claim 1, wherein a pivot edge of the covering plate is pivotally connected to a first edge of the slidable member, to pivot between an open position and a folding position.

3. The extension mechanism according to claim 1, wherein a connecting side of the covering plate is connected to a first side of the slidable member in a pivoting-sliding manner, so that the covering plate pivots between an open position and a folding position and moves between the folding position and a clamping position, and when the covering plate is at the open position, the covering plate is parallel to the slidable member, and one surface of the covering plate abuts against the bracket.

4. The extension mechanism according to claim 3, wherein the covering plate comprises a pivot portion, the slidable member has a rotary shaft portion, the rotary shaft portion is pivotally connected to the pivot portion and moves along a third axis, and the covering plate moves between the folding position and the clamping position.

5. The extension mechanism according to claim 4, wherein each of an upper surface and a lower surface of the covering plate has a reinforcing block, and the reinforcing blocks are correspondingly located at peripheries of the pivot portions.

6. The extension mechanism according to claim 3, wherein the carrier is configured to slidably connect to the bracket to move between a first position and a second position along the first axis; when the carrier is selectively located at the first position or the second position, the fastening portion is configured to clamp one of the first buckling portions; the slidable member is configured to slidably connect to the sliding groove to move between a third position and a fourth position along the second axis; when the slidable member is selectively located at the third position or the fourth position, the hook portion is configured to clamp one of the second buckling portions; the connecting side has a clamping portion, the bracket has four clamping holes, when the carrier is selectively located at the first position or the second position, the clamping portion is clamped to one of two clamping holes, and when the slidable member is selectively located at the third position or the fourth position, the clamping portion is clamped to one of the other two clamping holes.

7. The extension mechanism according to claim 3, wherein the carrier is configured to slidably connected to the bracket to move between a first position and a second position along the first axis; when the carrier is selectively located at the first position or the second position, the fastening portion is configured to clamp one of the first buckling portions; the slidable member is configured to slidably connected to the sliding groove to move between between a third position and a fourth position along the second axis; when the slidable member is selectively located at the third position or the fourth position, the hook portion is configured to clamp one of the second buckling portions; the connecting side has two clamping portions, the bracket has six clamping holes, when the carrier is selectively located at the first position or the second position, the clamping portions are respectively clamped to two of three clamping holes, and when the slidable member is selectively located at the third position or the fourth position, the clamping portions are respectively clamped to two of the other three clamping holes.

8. The extension mechanism according to claim 7, wherein the clamping portion has a bump, when the clamping portion is located in the clamping hole, the bump is in contact with an inner side of the clamping hole; the bump has a guide surface, and the guide surface is configured to guide the clamping portion to enter the clamping hole.

9. The extension mechanism according to claim 8, wherein a front section and a rear section of the guide surface respectively have an inclined section and a horizontal section, the inclined section is configured to guide the clamping portion to obliquely enter the clamping hole, and the horizontal section is configured to guide the clamping portion to vertically enter the clamping hole.

10. The extension mechanism according to claim 7, wherein the clamping portion has bumps respectively located at an upper surface and a lower surface of the covering plate, the bumps are in contact with inner sides of the clamping holes to make the covering plate to be substantially perpendicular to the slidable member.

11. The extension mechanism according to claim 7, wherein the first side of the slidable member has a convex point, and the convex point corresponds to a side end of the covering plate.

12. The extension mechanism according to claim 1, wherein the bracket comprises four buckling groups, each buckling group comprises two first buckling portions, the carrier comprises four fastening portions, the fastening portions are in a one-to-one correspondence to the buckling groups, and each fastening portion is selectively clamped to one of the two first buckling portions of the corresponding buckling group.

13. The extension mechanism according to claim 12, wherein each of the first buckling portions comprises a through hole, each of the fastening portions comprises an elastic piece, each of the elastic pieces is selectively clamped to one of two adjacent through holes, and an end portion of each of the elastic pieces has a guide section and a stop section extending outward from the guide section.

14. The extension mechanism according to claim 12, wherein each buckling group comprises two positioning portions, the carrier comprises four docking portions, the docking portions are in a one-to-one correspondence to the buckling groups, and each docking portion is selectively clamped to one of the two positioning portions of the corresponding buckling group.

15. The extension mechanism according to claim 1, wherein the bracket comprises a transverse groove hole, the transverse groove hole is adjacent to the first buckling portion, and the carrier has a moving portion corresponding to the transverse groove hole.

16. The extension mechanism according to claim 1, wherein the bracket comprises two longitudinal groove holes, each of the second buckling portions has a groove, the hook portion comprises an elastic arm and a hook part at an end portion of the elastic arm, the hook part is selectively clamped to one of two grooves, the elastic arm is selectively located at one of the two longitudinal groove holes, the carrier comprises a concave portion, and the concave portion is located at an inner side of the sliding groove for movement of the elastic arm.

17. The extension mechanism according to claim 1, wherein the carrier comprises a slide portion, the slide portion has an entering section and a translating section, the bracket comprises a limiting member, and the limiting member is docked to the slide portion to slide from the entering section to the translating section.

18. The extension mechanism according to claim 1, wherein a free side of the covering plate has a bent portion, and the bent portion extends along the second axis.

19. The extension mechanism according to claim 7, wherein a movement range of the carrier on the first axis on the bracket is within 21 mm to 25 mm, and a movement range of the slidable member on the second axis on the bracket is within 40.25 mm to 44.25 mm.

20. The extension mechanism according to claim 1, wherein the covering plate and the slidable member are integrated in one piece.

* * * * *